US012771300B2

(12) United States Patent
Drogi et al.

(10) Patent No.: US 12,771,300 B2
(45) Date of Patent: Oct. 20, 2026

(54) DYNAMIC OPTIMIZATION OF TRANSISTOR ARRAY IN POWER AMPLIFIER

(71) Applicant: SKYWORKS SOLUTIONS, INC., Irvine, CA (US)

(72) Inventors: Serge Francois Drogi, Flagstaff, AZ (US); Patrick Marcus Naraine, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 782 days.

(21) Appl. No.: 17/948,209

(22) Filed: Sep. 19, 2022

(65) Prior Publication Data

US 2023/0092678 A1 Mar. 23, 2023

Related U.S. Application Data

(60) Provisional application No. 63/247,261, filed on Sep. 22, 2021, provisional application No. 63/247,270,
(Continued)

(51) Int. Cl.
*H03F 3/19* (2006.01)
*H03F 1/02* (2006.01)
(Continued)

(52) U.S. Cl.
CPC ............. *H03F 1/3258* (2013.01); *H03F 1/02* (2013.01); *H03F 1/0205* (2013.01);
(Continued)

(58) Field of Classification Search
CPC ........ H03F 1/3258; H03F 1/02; H03F 1/0205; H03F 1/0222; H03F 1/3247; H03F 3/19;
(Continued)

(56) References Cited

U.S. PATENT DOCUMENTS 5,451,907 A * 9/1995 Keane .................... H03F 1/304 330/296
6,480,061 B2 * 11/2002 Dolman ................ H03G 3/001 330/136
(Continued)

OTHER PUBLICATIONS

"How Gallium Nitride (GaN) Enables Smaller, More Efficient Power Supplies" (Ron Stull) (Year: 2020).*

*Primary Examiner* — Andrea Lindgren Baltzell
*Assistant Examiner* — Nareh Shamiryan
(74) *Attorney, Agent, or Firm* — Chang & Hale LLP

(57) ABSTRACT

Dynamic optimization of transistor array in power amplifier. In some embodiments, a power amplification system can include a power amplifier including an array of transistors, with the array configured to receive an input signal and provide an amplified signal. The power amplification system can further include a monitoring system including a plurality of sensing circuits implemented at respective locations of the array, and a control system configured to obtain sensed information from the plurality of sensing circuits, and based on the information, generate a pattern of one or more transistor properties over the array to allow operation of the array in a desired manner based on the pattern.

20 Claims, 18 Drawing Sheets

Related U.S. Application Data filed on Sep. 22, 2021, provisional application No. 63/247,267, filed on Sep. 22, 2021, provisional application No. 63/247,263, filed on Sep. 22, 2021.

(51) Int. Cl.
*H03F 1/32* (2006.01)
*H03F 3/24* (2006.01)

(52) U.S. Cl.
CPC ............ *H03F 1/0222* (2013.01); *H03F 3/19* (2013.01); *H03F 3/245* (2013.01); *H03F 2200/129* (2013.01); *H03F 2200/451* (2013.01)

(58) Field of Classification Search
CPC ............... H03F 3/245; H03F 2200/129; H03F 2200/451
USPC ........ 330/127, 134, 279, 297, 290, 140, 289
See application file for complete search history.

(56) References Cited

U.S. PATENT DOCUMENTS

| | | | | |
|---|---|---|---|---|
| 2004/0085131 | A1* | 5/2004 | Glaser | H03F 1/30<br>330/289 |
| 2016/0277045 | A1* | 9/2016 | Langer | H03F 1/0222 |
| 2023/0268942 | A1* | 8/2023 | Ghannouchi | H04B 10/00<br>375/297 |

* cited by examiner

DYNAMIC OPTIMIZATION OF TRANSISTOR ARRAY IN POWER AMPLIFIER

CROSS-REFERENCE TO RELATED APPLICATION(S)

This application claims priority to U.S. Provisional Application Nos. 63/247,261 filed Sep. 22, 2021, entitled POWER AMPLIFICATION SYSTEM HAVING FORWARD AND REVERSE COUPLING AND DIGITAL PREDISTORTION COMPENSATION, 63/247,263 filed Sep. 22, 2021, entitled AMPLIFICATION SYSTEM HAVING POWER AMPLIFIER MEMORY CORRECTION AND/OR CURRENT COLLAPSE CORRECTION, 63/247,267 filed Sep. 22, 2021, entitled DYNAMIC OPTIMIZATION OF TRANSISTOR ARRAY IN POWER AMPLIFIER, and 63/247,270 filed Sep. 22, 2021, entitled POWER AMPLIFIER HAVING ADAPTIVE ARRAY SIZE, the disclosure of each of which is hereby expressly incorporated by reference herein in its respective entirety.

BACKGROUND

Field

The present disclosure relates to amplifiers for radio-frequency applications.

Description of the Related Art

In many radio-frequency (RF) devices, a signal to be transmitted is typically generated by a transceiver. Such a signal it then amplified by a power amplifier; and the amplified signal is routed to an antenna for transmission.

In the foregoing power amplification, a significant amount of power is utilized to provide desired amplification. Accordingly, it is desirable to have the power amplifier operate efficiently and provide proper amplification for the signal.

SUMMARY

In some implementations, the present disclosure relates to a power amplification system that includes a power amplifier configured to receive an input signal and provide an amplified signal. The power amplification system further includes a monitor and adapt system configured to monitor one or more conditions associated with the power amplifier, and to adapt the power amplifier based on monitored information. The one or more conditions includes forward power and reverse power at an output of the power amplifier, a supply current, an injection voltage point and temperature associated with the power amplifier, and sensed information from a plurality of locations of an array of the power amplifier. The adaptation includes some or all of (1) adjustment of an operating parameter of the power amplifier based on the forward power and reverse power, (2) correction of either or both of a memory effect and a current collapse effect associated with the power amplifier, (3) generation of a pattern of one or more transistor properties over the array to allow operation of the array in a desired manner based on the pattern, and (4) adjustment of the size of the array.

In accordance with some implementations, the present disclosure relates to a power amplification system that includes a power amplifier configured to receive an input signal and provide an amplified signal, and a coupler implemented relative to an output of the power amplifier and configured to measure forward power and reverse power at the output of the power amplifier. The power amplification system further includes a controller configured to receive information representative of the measured forward power and reverse power, and based on the information, generate a control signal for adjusting a parameter associated with the power amplifier.

In some embodiments, the control signal can include a signal for providing digital predistortion to a digital signal corresponding to the input signal provided to the power amplifier.

In some embodiments, the controller can include either or both of an artificial intelligence capability and a neural network capability. The controller includes a processor configured to provide either or both of the artificial intelligence capability and the neural network capability.

In some embodiments, both of the processor and the power amplifier can be implemented within same location or device. In some embodiments, the processor and the power amplifier can be implemented at different locations or devices.

In some embodiments, the controller can be configured to determine a voltage standing wave ratio based on the measured forward power and reverse power. The control signal can include a signal for adjusting a bias being provided to the power amplifier based on the voltage standing wave ratio.

In some embodiments, the power amplifier can include an amplifying transistor having a gate, a source, and a drain, such that the gate is an input for receiving the input signal and the drain is connected to the output of the power amplifier. The control signal can include a signal for adjusting either or both of gate-source voltage and supply voltage to compensate for a load mismatch based on the voltage standing wave ratio. In some embodiments, the amplifying transistor can be implemented as a gallium nitride (GaN) transistor.

In some embodiments, the coupler can be configured to include four ports corresponding to a first port coupled to the output of the power amplifier, a second port coupled to an antenna node, a third port for forward power measurement, and a fourth port for reverse power measurement. The third port and the fourth port can be coupled to or be capable of being coupled to the controller.

According to some teachings, the present disclosure relates to a method for operating a power amplification system. The method includes providing an input signal to a power amplifier and amplifying the input signal with the power amplifier to generate an amplified signal. The method further includes measuring forward power and reverse power at an output of the power amplifier, and generating a control signal based on the measured forward power and reverse power for adjusting a parameter associated with the power amplifier.

In some embodiments, the method can further include performing a digital predistortion operation to a digital signal corresponding to the input signal provided to the power amplifier based on the control signal.

In some embodiments, the generating of the control signal can include either or both of an artificial intelligence operation and a neural network operation. The generating of the control signal can include determining a voltage standing wave ratio based on the measured forward power and reverse power. The generating of the control signal can include providing a signal for adjusting a bias being provided to the power amplifier based on the voltage standing wave ratio. The generating of the control signal can include providing a signal for adjusting either or both of gate-source voltage and supply voltage to compensate for a load mismatch based on the voltage standing wave ratio.

In some implementations, the present disclosure relates to a wireless system that includes a baseband sub-system configured to process a digital signal to be transmitted, a power amplifier configured to receive an analog signal representative of the digital signal and provide an amplified signal, and an antenna in communication with an output of the power amplifier and configured to support transmission of the amplified signal. The wireless system further includes a monitor and adapt system implemented to measure forward power and reverse power at the output of the power amplifier, and to generate a control signal for adjusting a parameter associated with the power amplifier based on the measured forward power and reverse power.

In some embodiments, the wireless system can be implemented in a base station. In some embodiments, the base station can include a cellular base station functionality.

In some embodiments, the wireless system can be implemented in a mobile device. In some embodiments, the mobile device can include a cellular functionality.

According a number of teachings, the present disclosure relates to a power amplification system that includes a power amplifier including an amplifying transistor configured to receive an input signal and provide an amplified signal, and a monitoring system configured to monitor one or more of a supply current for the amplifying transistor, an injection voltage point of the amplifying transistor, forward power at an output of the amplifying transistor, and temperature of the amplifying transistor. The power amplification system further includes a control system configured to obtain monitored information, and based on the information, generate a control signal for correcting either or both of a memory effect of the amplifying transistor and a current collapse effect of the amplifying transistor.

In some embodiments, the control signal can further include a signal for providing digital predistortion to a digital signal corresponding to the input signal provided to the power amplifier.

In some embodiments, the controller can include either or both of an artificial intelligence capability and a neural network capability. The controller can include a processor configured to provide either or both of the artificial intelligence capability and the neural network capability.

In some embodiments, both of the processor and the power amplifier can be implemented within same location or device. In some embodiments, the processor and the power amplifier can be implemented at different locations or devices.

In some embodiments, the controller can be configured to generate a warning flag to a system above the power amplification system.

In some embodiments, the control signal can include a signal for adjusting an injection voltage of the amplifying transistor. In some embodiments, the amplifying transistor can include a gate, a source, and a drain, such that the gate is an input for receiving the input signal and the drain is connected to the output of the power amplifier. In some embodiments, the injection voltage can include a gate-source voltage. In some embodiments, the amplifying transistor can be implemented as a gallium nitride (GaN) transistor.

In some teachings, the present disclosure relates to a method for operating a power amplification system. The method includes providing an input signal to an amplifying transistor of a power amplifier, amplifying the input signal with the amplifying transistor to generate an amplified signal, and monitoring one or more of a supply current for the amplifying transistor, an injection voltage point of the amplifying transistor, forward power at an output of the amplifying transistor, and temperature of the amplifying transistor. The method further includes generating a control signal based on monitored information for correcting either or both of a memory effect of the amplifying transistor and a current collapse effect of the amplifying transistor.

In some embodiments, the method can further include performing a digital predistortion operation to a digital signal corresponding to the input signal provided to the power amplifier based on the control signal.

In some embodiments, the generating of the control signal can include either or both of an artificial intelligence operation and a neural network operation. The generating of the control signal can include providing a warning flag to a system above the power amplification system.

In some embodiments, the generating of the control signal can include providing a signal for adjusting an injection voltage of the amplifying transistor. The injection voltage can include a gate-source voltage.

In some implementations, the present disclosure relates to a wireless system that includes a baseband sub-system configured to process a digital signal to be transmitted, a power amplifier configured to receive an analog signal representative of the digital signal and provide an amplified signal, and an antenna in communication with an output of the power amplifier and configured to support transmission of the amplified signal. The wireless system further includes a monitor and adapt system implemented to monitor one or more of a supply current for the amplifying transistor, an injection voltage point of the amplifying transistor, forward power at an output of the amplifying transistor, and temperature of the amplifying transistor. The monitor and adapt system is further configured to obtain monitored information, and based on the information, generate a control signal for correcting either or both of a memory effect of the amplifying transistor and a current collapse effect of the amplifying transistor.

In some embodiments, the wireless system can be implemented in a base station. In some embodiments, the base station can include a cellular base station functionality.

In some embodiments, the wireless system can be implemented in a mobile device. In some embodiments, the mobile device can include a cellular functionality.

According to a number of implementations, the present disclosure relates to a power amplification system that includes a power amplifier including an array of transistors, with the array being configured to receive an input signal and provide an amplified signal. The power amplification system further includes a monitoring system including a plurality of sensing circuits implemented at respective locations of the array. The power amplification system further includes a control system configured to obtain sensed information from the plurality of sensing circuits, and based on the information, generate a pattern of one or more transistor properties over the array to allow operation of the array in a desired manner based on the pattern.

In some embodiments, the control signal can further include a signal for providing digital predistortion to a digital signal corresponding to the input signal provided to the power amplifier.

In some embodiments, the controller can include either or both of an artificial intelligence capability and a neural network capability. The controller can include a processor configured to provide either or both of the artificial intelligence capability and the neural network capability.

In some embodiments, both of the processor and the power amplifier can be implemented within same location or device. In some embodiments, the processor and the power amplifier can be implemented at different locations or devices.

In some embodiments, the pattern generated by the controller can include a predictive pattern.

In some embodiments, the plurality of sensing circuits can be configured such that the monitored information includes some or all of temperature, gain and bias condition of respective transistors in the array. In some embodiments, the transistors can be implemented as gallium nitride (GaN) transistors having memory properties. In some embodiments, the controller can be configured such that the pattern generated by the controller includes a statistical analysis of some or all of the monitored information.

In some implementations, the present disclosure relates to a method for operating a power amplification system. The method includes providing an input signal to an array of transistors of a power amplifier, and amplifying the input signal with the array to generate an amplified signal. The method further includes sensing one or more conditions associated with the transistors at a plurality of locations of the array, and generating a pattern of one or more transistor properties based on information from the sensing to allow operation of the array in a desired manner based on the pattern.

In some embodiments, the method can further include performing a digital predistortion operation to a digital signal corresponding to the input signal provided to the power amplifier based on the pattern.

In some embodiments, the generating of the pattern can include either or both of an artificial intelligence operation and a neural network operation. In some embodiments, the generating of the pattern can include a predictive pattern operation.

In some embodiments, the sensing of the one or more conditions can include sensing of some or all of temperature, gain and bias condition of respective transistors in the array.

In some implementations, the present disclosure relates to a wireless system that includes a baseband sub-system, a power amplifier configured to receive an analog signal representative of the digital signal and provide an amplified signal, the power amplifier including an array of transistors, and an antenna in communication with an output of the power amplifier and configured to support transmission of the amplified signal. The wireless system further includes a monitor and adapt system including a plurality of sensing circuits implemented at respective locations of the array, and a control system configured to obtain sensed information from the plurality of sensing circuits, and based on the information, generate a pattern of one or more transistor properties over the array to allow operation of the array in a desired manner based on the pattern.

In some embodiments, the wireless system can be implemented in a base station. In some embodiments, the base station can include a cellular base station functionality.

In some embodiments, the wireless system can be implemented in a mobile device. In some embodiments, the mobile device can include a cellular functionality.

In accordance with some implementations, the present disclosure relates to a power amplification system that includes a power amplifier including a variable size array of transistors, and a monitoring system configured to monitor one or more conditions associated with the power amplifier. The power amplification system further includes a control system configured to obtain monitored information from the monitoring system, and based on the information, generate a control signal to adjust the size of the array of transistors.

In some embodiments, the control signal can further include a signal for providing digital predistortion to a digital signal corresponding to the input signal provided to the power amplifier.

In some embodiments, the controller can further include either or both of an artificial intelligence capability and a neural network capability. The controller can include a processor configured to provide either or both of the artificial intelligence capability and the neural network capability.

In some embodiments, both of the processor and the power amplifier can be implemented within same location or device. In some embodiments, the processor and the power amplifier can be implemented at different locations or devices.

In some embodiments, the array of transistors can be arranged in a plurality of sections, such that the size of the array is implemented by use of some or all of the sections of transistors.

In some embodiments, the monitored information can include some or all of average power, frequency, supply voltage, temperature and mismatch condition associated with the power amplifier.

In some embodiments, the control signal can be configured to allow adjustment of the array of transistors based on one or more of operating conditions including lower duty cycle, lower average power and lower temperature.

In some embodiments, the controller can be configured to include learning capability to allow the adjustment of the size of the array of transistors to be at least quasi-seamless.

In some embodiments, array of transistors can be implemented as an array of gallium nitride (GaN) transistors.

According to some teachings, the present disclosure relates to a method for operating a power amplification system. The method includes providing an input signal to variable size array of transistors of a power amplifier, and amplifying the input signal with the array to generate an amplified signal. The method further includes monitoring one or more conditions associated with the power amplifier, and generating a control signal to adjust the size of the array on the monitoring.

In some embodiments, the method can further include performing a digital predistortion operation to a digital signal corresponding to the input signal provided to the power amplifier based on the control signal.

In some embodiments, either or both of the monitoring and the generating can include some or all of an artificial intelligence operation, a neural network operation, and a learning operation.

In some embodiments, the monitoring can include monitoring some or all of average power, frequency, supply voltage, temperature and mismatch condition associated with the power amplifier.

In some embodiments, the generating of the control signal can include configuring the control signal to allow adjustment of the array of transistors based on one or more of operating conditions including lower duty cycle, lower average power and lower temperature.

In some implementations, the present disclosure relates to a wireless system that includes a baseband sub-system, a power amplifier configured to receive an analog signal representative of the digital signal and provide an amplified signal, the power amplifier including a variable size array of transistors, and an antenna in communication with an output of the power amplifier and configured to support transmission of the amplified signal. The wireless system further includes a monitor and adapt system configured to monitor one or more conditions associated with the power amplifier, and a control system configured to obtain monitored information from the monitoring system, and based on the information, generate a control signal to adjust the size of the array of transistors.

In some embodiments, the wireless system can be implemented in a base station. In some embodiments, the base station can include a cellular base station functionality.

In some embodiments, the wireless system can be implemented in a mobile device. In some embodiments, the mobile device can include a cellular functionality.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 17/948,207, entitled POWER AMPLIFICATION SYSTEM HAVING FORWARD AND REVERSE COUPLING AND DIGITAL PREDISTORTION COMPENSATION, U.S. patent application Ser. No. 17/948,208, entitled AMPLIFICATION SYSTEM HAVING POWER AMPLIFIER MEMORY CORRECTION AND/OR CURRENT COLLAPSE CORRECTION, and U.S. patent application Ser. No. 17/948,210, entitled POWER AMPLIFIER HAVING ADAPTIVE ARRAY SIZE, the disclosure of each of which is filed on even date herewith and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Figure 1:
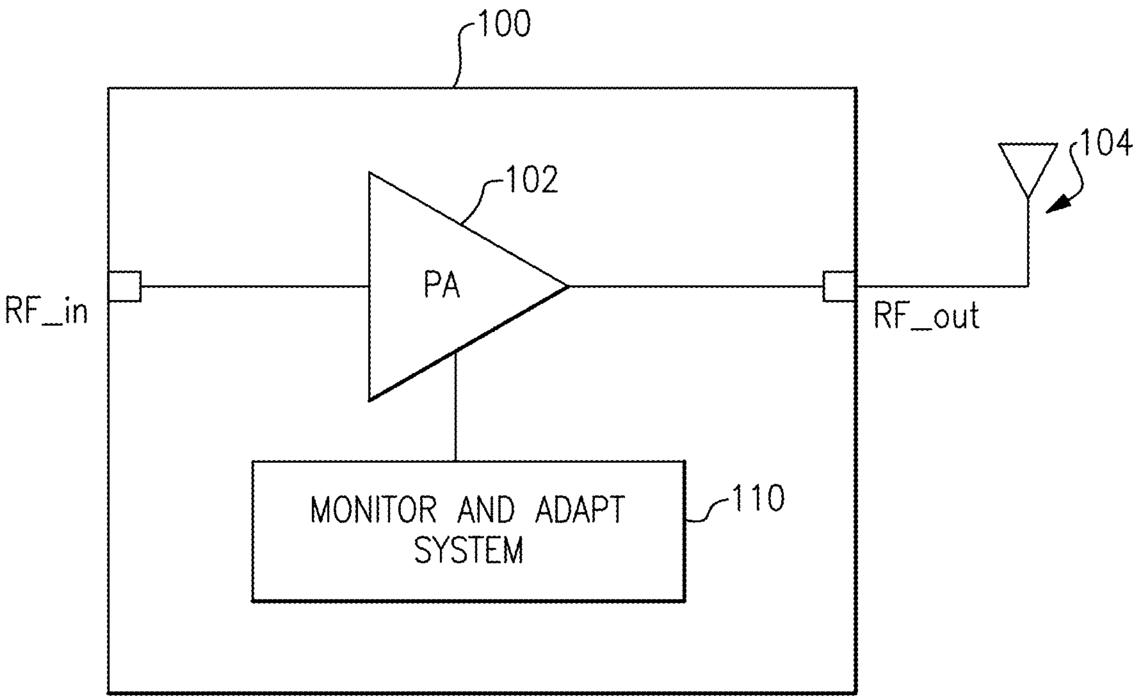
FIG. 1 depicts a power amplification system that includes a power amplifier for amplifying a radio-frequency (RF) signal received as an input to provide an amplified RF signal as an output.

FIG. 1 depicts a power amplification system 100 that includes a power amplifier (PA) 102 for amplifying a radio-frequency (RF) signal received as an input (RF_in) to provide an amplified RF signal as an output (RF_out). Such an amplified RF signal is shown to be routed to an antenna 104 for transmission. For the purpose of description, an RF signal may also be referred to as a signal.

In FIG. 1, the power amplification system 100 is shown to further include a system 110 configured to monitor one or more parameters associated with operation of the power amplifier 102, and based on such monitored parameter(s), adapt one or more features associated with the power amplifier 102. Examples of such monitored parameter(s) and feature(s) associated with the power amplifier 102 are described herein in greater detail. While such examples are described in the context of power amplifiers, it will be understood that one or more features of the present disclosure can also be implemented in other types of amplifiers, including other types of RF amplifiers.

Figure 2:
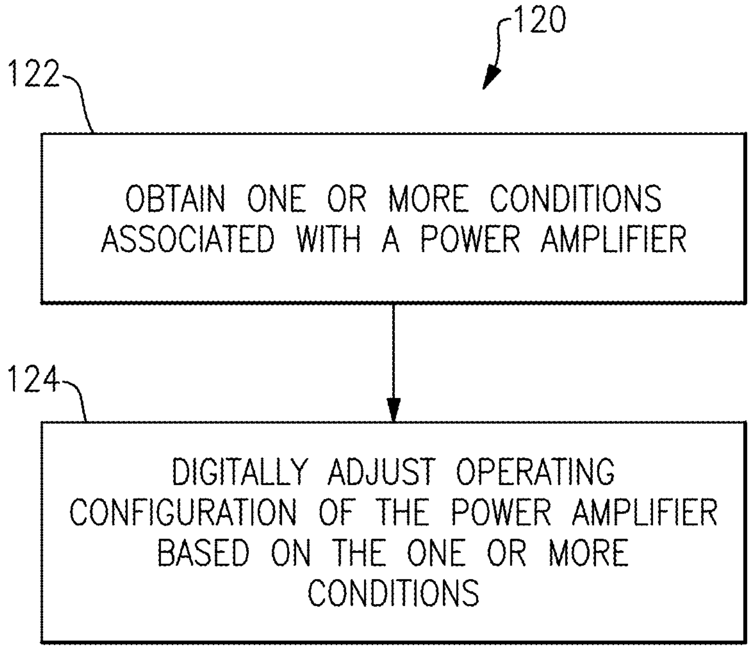
FIG. 2 shows a process that can be implemented with the power amplification system of FIG. 1.

FIG. 2 shows a process 120 that can be implemented with the power amplification system 100 of FIG. 1. In block 122, one or more conditions associated with a power amplifier can be obtained. In block 124, an operating configuration of the power amplifier can be adjusted based on the one or more conditions. In some embodiments, such adjusting of the operating configuration of the power amplifier can include digitally adjusting an operating configuration of the power amplifier. Examples of such digital adjustment are described herein in greater detail.

Figure 3:
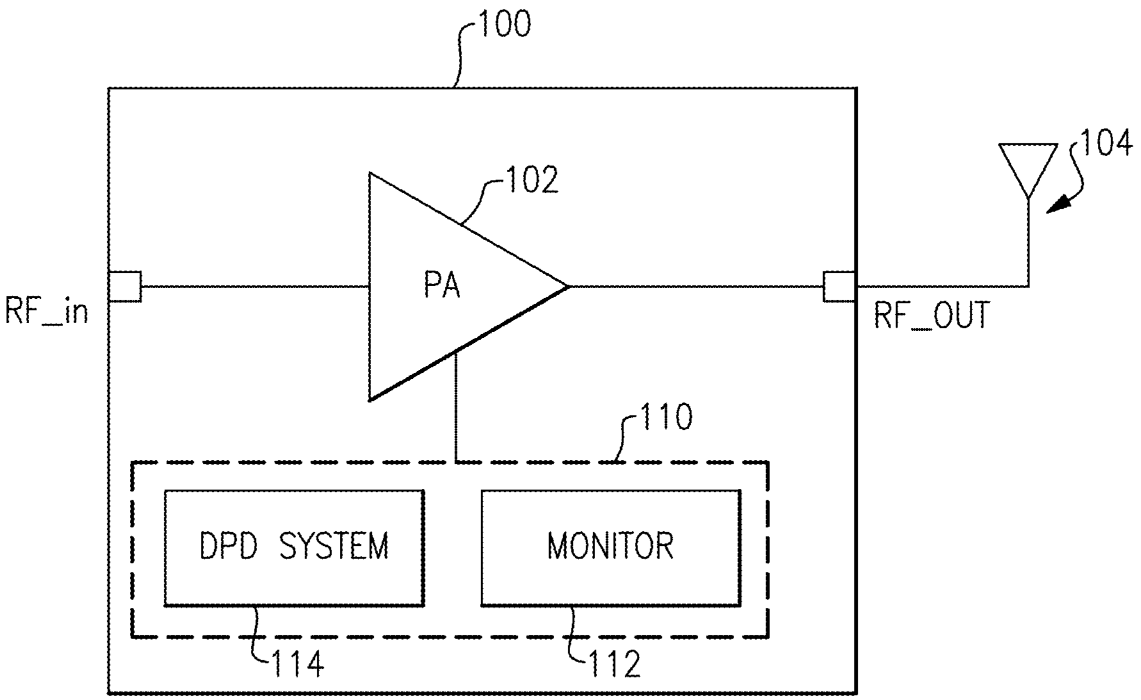
FIG. 3 shows a power amplification system that can be a more specific example of the power amplification system of FIG. 1.

FIG. 3 shows a power amplification system 100 that can be a more specific example of the power amplification system 100 of FIG. 1. FIG. 3 shows that in some embodiments, the power amplification system 100 can include a system 110 having a monitor 112 and a digital predistortion (DPD) system 114. The monitor 112 can be configured to obtain one or more conditions associated with a power amplifier 102, and the DPD system 114 can be configured to digitally adapt one or more features associated with the power amplifier 102.

Figure 4:
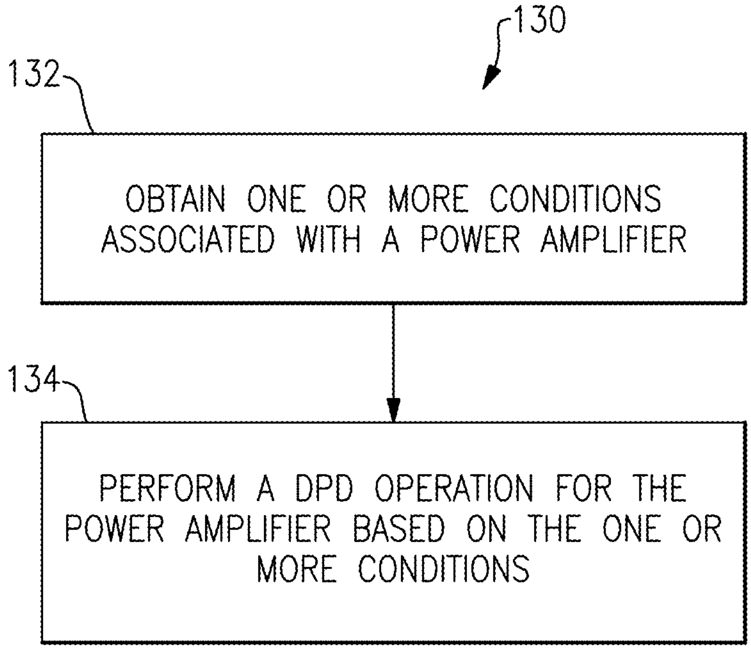
FIG. 4 shows a process that can be implemented with the power amplification system of FIG. 3.

FIG. 4 shows a process 130 that can be implemented with the power amplification system 100 of FIG. 3. In block 132, one or more conditions associated with a power amplifier can be obtained. In block 134, a DPD operation for the power amplifier can be performed based on the one or more conditions.

Example 1

In many radio-frequency (RF) applications, power amplifiers (PAs) are implemented with more non-linear designs, but with higher efficiency. In such designs, overall transmit (Tx) system linearity can be maintained with use of a baseband digital signal processing (DSP) controller to provide digital pre-distortion (DPD) for a signal that will eventually be amplified by a power amplifier.

Figure 5:
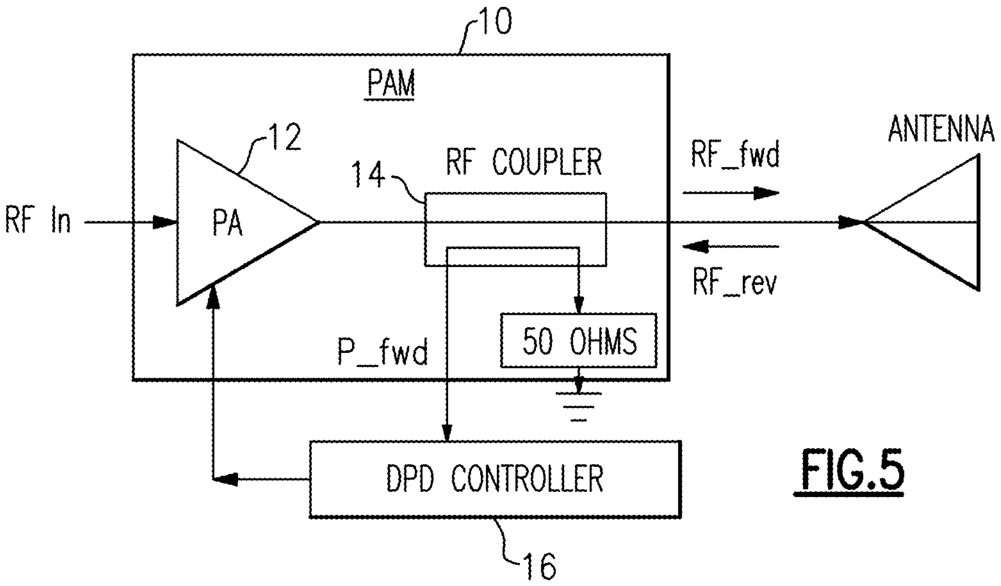
FIG. 5 shows an example of a power amplification system that utilizes a controller that obtains only a forward power information from an RF coupler 14.

FIG. 5 shows an example of a power amplification system that utilizes the foregoing design. More particularly, in the example of FIG. 5, a DPD controller 16 obtains only a forward power (P_fwd) information, from an RF coupler 14, of an amplified signal output from a power amplifier 12. Such power amplifier and RF coupler are typically implemented on a power amplifier module (PAM) or a front-end module (FEM) 10.

Based on the observed forward power information such as signal amplitude and phase information, the DPD controller 16 can be utilized to estimate and correct any non-linearities associated with the power amplifier 12. Such a correction typically includes digital pre-distortion to I/Q signals.

Figure 6:
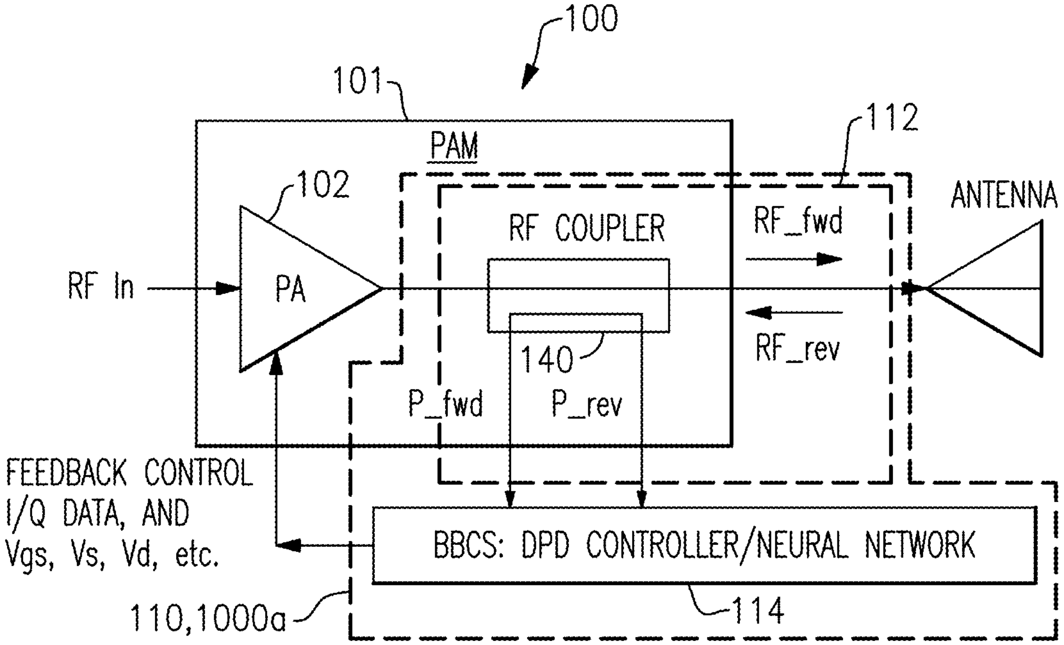
FIG. 6 shows that in some embodiments, a power amplification system can include a power amplifier that provides an amplified signal to an output signal path, and a power coupler for obtaining both forward power and reverse power information.

FIG. 6 shows that in some embodiments, a power amplification system 100 can include a power amplifier 102 configured to amplify an input signal (RF In) and generate an amplified signal that is routed to an antenna for transmission through an output signal path. In such an output signal path between the power amplifier 102 and the antenna, there is forward power (P_fwd) associated with forward-direction signal(s) (RF_fwd) (including the amplified signal being routed to the antenna), and reverse power (P_rev) associated with reverse-direction signal(s) (RF_rev) (including, for example, a reflected signal from the antenna and a received signal from the antenna).

In the example of FIG. 6, an RF coupler 140 is shown to be implemented along the signal path between the power amplifier 102 and the antenna. In some embodiments, information for both of the forward power (P_fwd) and reverse power (P_rev) can be obtained utilizing the RF coupler 140. Such information can be provided to a controller 114, and the controller 114 can generate one or more control signals to adjust an operation involving the power amplifier 102. Such an adjustment can include, for example, some or all of digital pre-distortion to I/Q signals and adjustments to various voltages (e.g., Vgs, Vs, Vd, etc.) associated with an amplifying transistor of the power amplifier 102. It is noted that in some embodiments, the adjustments to the various voltages do not necessarily need to be performed along with the digital pre-distortion operation.

In some embodiments, both of the measured forward and reverse powers (P_fwd, P_rev) can be used by the controller 114 that includes and/or utilizes artificial intelligence (AI) and/or neural network adaptive algorithms that provide some or all of the following functionalities. For example, DPD corrections can be applied to VQ signals. In another example, the controller can learn how the PA 102 is corrupted or degraded based on the received forward and reverse power information. In yet another example, a neural network can be utilized to allow the controller to be taught to autonomously correct power amplifier related parameters such as load impedances (VSWR) and process drift which can occur over time.

In the example of FIG. 6, the controller 114 is depicted as a baseband controller system (BBCS). In some embodiments, such a controller system can be coupled to a forward and reverse power coupler (FRPC) 140. The measured power information (P_fwd, P_rev) from the FRPC 140 can be passed to a DPD controller with learning or learning-like capabilities such as artificial intelligence (AI) and/or neural network (NN) to, for example, determine levels of forward and reverse RF signal strengths and to independently correct for any detected signal errors.

In some embodiments, knowledge of forward and reverse signal strengths can be used by a baseband controller to detect and correct for any degradations of the power amplifier 102 (e.g., gain drop, current fluctuations, semiconductor degradations, etc.) that can affect the power amplifier's output power level.

In some embodiments, knowledge of the forward and reverse signal strengths can be utilized by the BBCS 114 to determine the VSWR seen by the power amplifier 102. The BBCS can then adjust bias currents and/or supply voltages for the power amplifier 102 to compensate for increased or decreased VSWR levels. It is noted that if an impedance tuner is present between the antenna and the power amplifier output, the tuner can be adjusted synchronously with DPD coefficients, and a neural network is preferable for learning a desired correction based on information obtained from the coupler. For example, a tilt on reflected power versus frequency can indicate which way the tuner should be adjusted, rather than pursuing a blind tuning approach.

Referring to FIG. 6, it is also noted that in some embodiments, a power amplifier module (PAM) 101 can be configured such that the RF coupler 140 includes four ports to provide the above-described measurements and utilization of the forward and reverse power information (P_fwd, P_rev). As described herein, such information can be processed with a DPD controller and neutral network (NN) to monitor forward and reverse power (P_fwd and P_rev), to determine VSWR seen by the power amplifier 102. The neural network can then be utilized to make adjustments to power amplifier bias, Vgs and Vdd to compensate for any load mismatch that may be present (e.g., in 5G mMIMO cellular systems).

It is also noted that with one or more features of the present disclosure, any slow RF degradation (e.g., monitored from the forward signal, under low VSWR condition) can be corrected by the neural network by using a combination of input signals such as gate currents, bias voltages, drain voltages, etc.

It is also noted that the power amplifier module monitoring as described herein can result in a power amplifier to be more robust against reverse inter-modulation distortion, and be less susceptible to external blockers. It is noted that when such an external blocker is present at the antenna, its power will be significantly stronger when measured on the reverse side of the directional coupler than on the forward side. The difference in power depends on the coupler directivity as well as on the power amplifier output impedance. In practical designs, when an external signal is injected into the antenna, it typically appears 10 times stronger on the reverse side of the coupler than on the forward side, thereby allowing it to be detected and possibly compensated for.

In the example of FIG. 6, a monitor system 112 (112 in FIG. 3) can be considered to include the forward and reverse power coupler (FRPC) 140, and a DPD system 114 (114 in FIG. 3) can be considered to include the BBCS 114. Thus, in some embodiments, a monitor and adapt system for the example of FIG. 6 is indicated as 110, and also as 1000*a*.

Example 2

In many radio-frequency (RF) applications, such as in cellular base stations, power amplification demands higher peak powers with higher efficiency. Power amplifiers (PAs) built with higher peak power typically need to handle high junction temperatures. At high junction temperatures and high output power, semiconductor materials tend to experience electron trapping effects, which can lead to current collapse and distorted RF signal output.

Described herein are examples of how some or all of such problems can be addressed by a power amplification system having a monitor and adapt system such as the examples of FIGS. 1 and 3.

Figure 7:
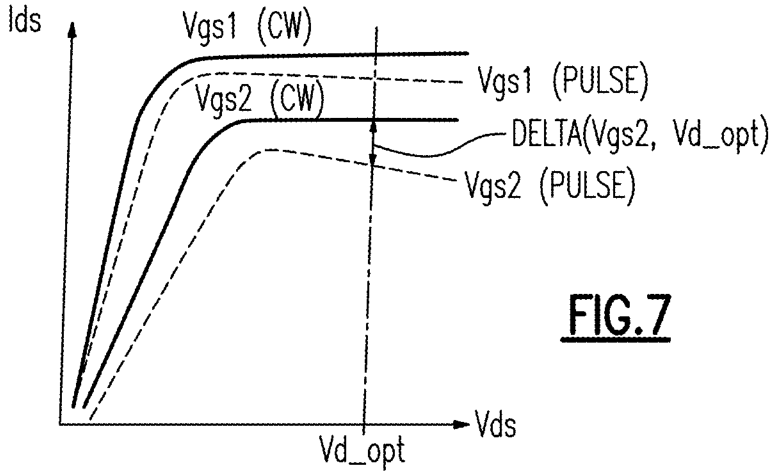
FIG. 7 shows a typical current collapse seen in some high-power power amplifiers due to trapping effects in semiconductor layers.

FIG. 7 shows a typical current collapse seen in high power gallium nitride (GaN) power amplifiers due to trapping effects in semiconductor layers. It is noted that power amplifier semiconductor materials can exhibit a phenomena referred to as current collapse, where Delta(Vgs, Vdd) is a measure of how much the current is reduced from a nominal un-stressed CW condition. The amount of such Delta(Vgs, Vdd) is primarily related to gate voltage (Vgs), operational drain voltage (Vdd_opt), signal pulse width (PW), pulse duty cycle, output RF power, and temperature.

Figure 8:
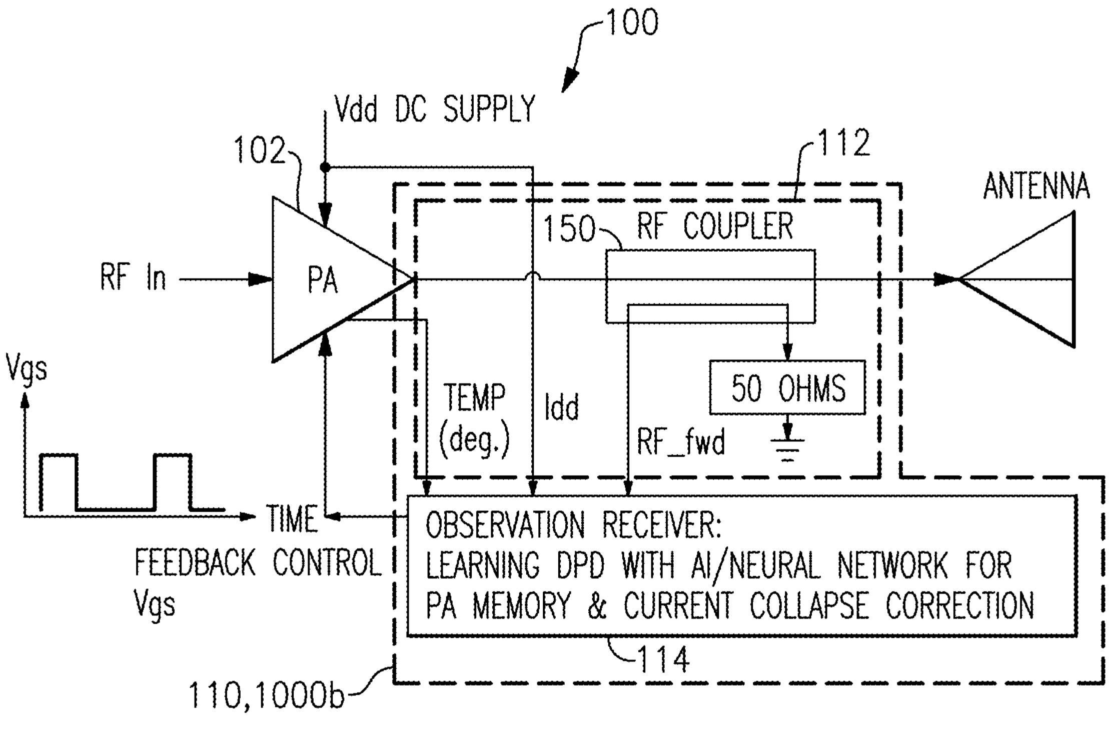
FIG. 8 shows that in some embodiments, a power amplification system can include one or more features configured to detect and correct at least some of the effect of FIG. 7.

FIG. 8 shows that in some embodiments, a power amplification system 100 can include a power amplifier 102 configured to amplify an input signal (RF In) and generate an amplified signal that is routed to an antenna for transmission through an output signal path. In such an output signal path between the power amplifier 102 and the antenna, there is forward power (P_fwd) associated with forward-direction signal(s) (RF_fwd) (including the amplified signal being routed to the antenna.

In the example of FIG. 8, an RF coupler 150 is shown to be implemented along the signal path between the power amplifier 102 and the antenna. In some embodiments, information for the forward power (P_fwd) can be obtained utilizing the RF coupler 150. Such information can be provided to a controller 114, and the controller 114 can generate one or more control signals to adjust an operation involving the power amplifier 102.

In some embodiments, the power amplification system 100 of FIG. 8 can be configured to detect and correct for power amplifier memory and current collapse effects, such as the effects of FIG. 7.

In the power amplification system 100 of FIG. 8, monitored parameters associated with the power amplifier 102 can include some or all of Idd currents, a Vgs injection point, a sample of RF signal (via the RF coupler 150), and a sensed temperature. Such monitored parameters can be provided to an observation receiver 114 having a controller with neutral network (NN) capabilities, which can be used to monitor Idd at given Vdd, and determine if the monitored current level is within an acceptable range, for a given RF output power and temperature normal.

In some embodiments, the neutral network associated with the observation receiver 114 can be "trained" to apply a desired Vgs when an unacceptable current collapse is detected on Vdd supply. In some embodiments, depending on some or all of measured Idd current collapse, Delta(Vgs, Vds), pulse width, duty cycle, desired Pout and present temperature, the neural network can set a warning flag for the power amplification system 100, and/or try to compensate for the current collapse by adjusting Vgs.

It is noted that the power amplification system 100 of FIG. 8 can be configured to not only correct for I/Q signal distortions introduced by the power amplifier, but also correct for memory and current collapse effects of the power amplifier 102. It is also noted that the power amplification system 100 of FIG. 8 can also be configured to calibrate the power amplifier 102 to update the memory effects as temperature, signal pulse width and duty cycle change. Such calibration can also be utilized to track and correct for power amplifier aging effects.

In the example of FIG. 8, a monitor system 112 (112 in FIG. 3) can be considered to include monitoring of power of the RF signal output from the power amplifier 102 (e.g., by the coupler 150), monitoring of the Idd current, and monitoring of the present temperature. A DPD system 114 (114 in FIG. 3) can be considered to include the observation receiver 114. Thus, in some embodiments, a monitor and adapt system for the example of FIG. 8 is indicated as 110, and also as 1000*b*.

Example 3

Figure 9:
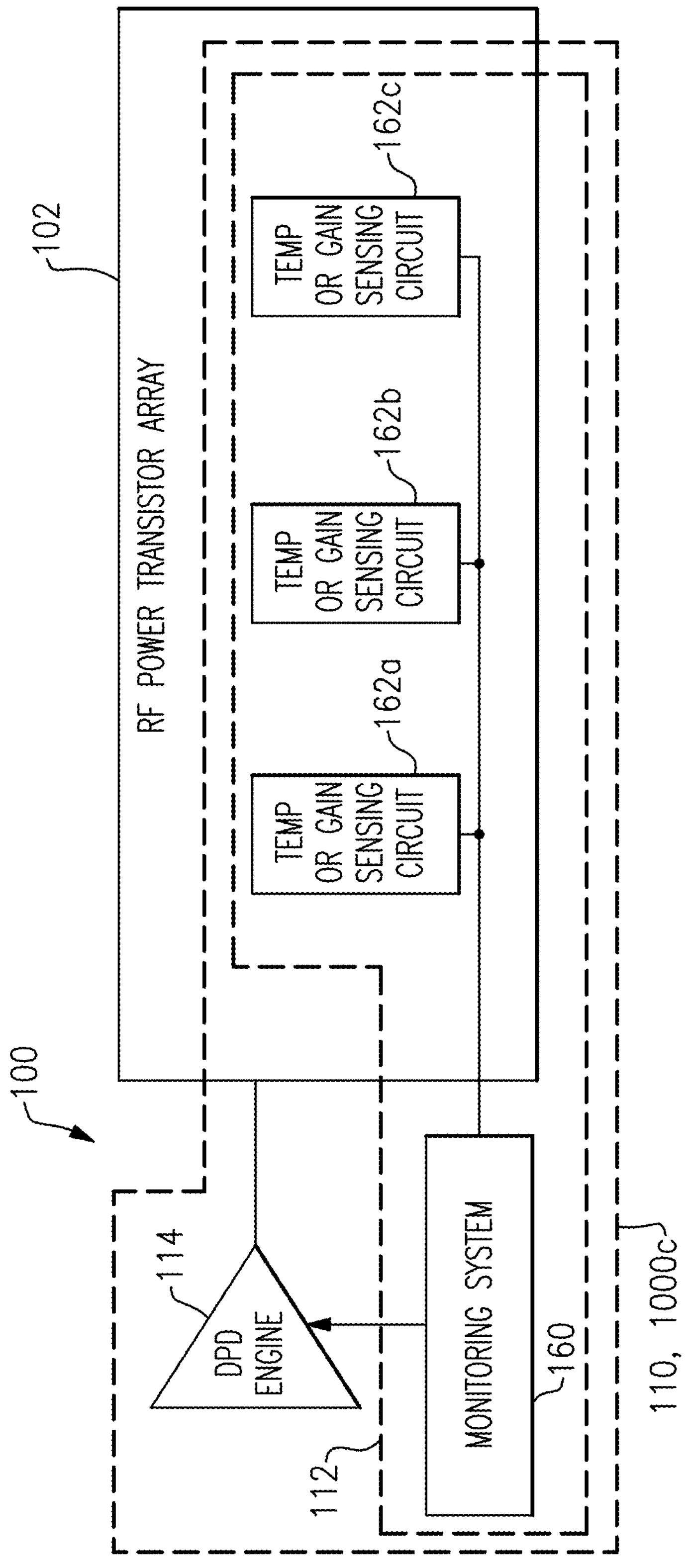
FIG. 9 shows that in some embodiments, a power amplification system can be configured to dynamically provide optimized or desired bias control for a transistor array of a power amplifier while the array is in use.

FIG. 9 shows that in some embodiments, a power amplification system 100 can be configured to dynamically provide optimized or desired bias control for a transistor array of a power amplifier 102 while the array is in use. In some embodiments, such a power amplification system can be utilized inside a system such as a cellular base-station, based on a plurality of sensors (e.g., temperature and/or gain sensors) and control points (e.g., bias control points).

It is noted that some types of RF transistors have short and long term memory effects. By dispersing sensor devices across the array, a predictive algorithm can be run in a controller such as a neural network to adjust both DPD and local bias. For time division duplex (TDD) systems, DPD parameters can be set based on the sensors before an RF transmission is started, thus considerably speeding up the convergence of the DPD system. It is noted that an advantage of a distributed sensing system can reveal statistical changes in the array that single-sensor solutions cannot.

It is noted that some designs often utilize one temperature sensor system and do not allow for directed controls inside an array. While such a single sensor provides information that could be used to improve saturation power and avoid a pinching in one area of the array, it does not provide any information effects such as propagation of thermal gradients thru the array.

FIG. 9 shows that in some embodiments, a plurality of circuits (e.g., 162*a*, 162*b*, 162*c*) configured as sensors can be embedded within the RF power transistor array of the power amplifier 102. Such sensor circuits can provide sensed information to a DPD engine 114, through a monitoring system 160, of effects such as evolution of thermal transients thru the power amplifier 102.

The foregoing sensed information can be utilized to, for example, optimize starting coefficients for DPD based on recognizing certain states, or more preferably, certain patterns of behavior. For example, suppose that the power amplifier 102 heats up in response to a power increase. Since the array of the power amplifier 102 typically does not heat up uniformly, it is expected that during the heating transition the device characteristics will change. Thus, the series of sensors (e.g., 162*a*, 162*b*, 162*c*) can be utilized to evaluate time constant(s) associated with the change.

If the RF transistor devices are arranged in a way such that they receive the same bias, behavior of trap charges is also likely to match that of an active RF transistor. Such a property can be learned by a neural network and used to adjust the DPD following a learned pattern.

It is noted that by utilizing the plurality of sensor circuits and the foregoing pattern learning functionality, device failures due to over-crowding in the array could be prevented, since there is a mechanism to monitor multiple locations inside the packaged device for a fast temperature rise. Such a failure-prevention functionality can be particularly beneficial for power amplifiers having a large array.

It is noted that in transistors such as gallium nitride (GaN) transistors, memory is a known issue and depends on the prior condition of use of the transistor. Such memory can be detected by measuring the bias, and remains a statistical phenomena. Thus, by submitting a number of transistors to same conditions (e.g., temperature, bias, power), one can expect to have detectable bias variations. Since this is a statistical change, a sample size larger than one can be obtained, and such a sample size can be accommodated by the plurality of sensor circuits (e.g., 162*a*, 162*b*, 162*c* in FIG. 9) to evaluate the state of a large array.

In some embodiments, a change in DC bias can be monitored; but while it correlates to RF performance, the RF performance typically does not change in a linear relation to the bias change. Thus, such monitoring of DC bias change can be implemented with a learning system that can process multivariable non-linear functions, with a neural engine being one example.

It is noted that since all the transistors in an array are not subjected to the same temperature and RF power, differences across the array will likely be present. Adjusting bias to individual sections of the array can be achieved, as well a good prediction of the whole array performance, based on, for example, the worst transistor in the array. Thus, the use of a plurality of sensor circuits and control is shown to be desirable for digital pre-distortion with training influenced by the sensors.

Figure 10:
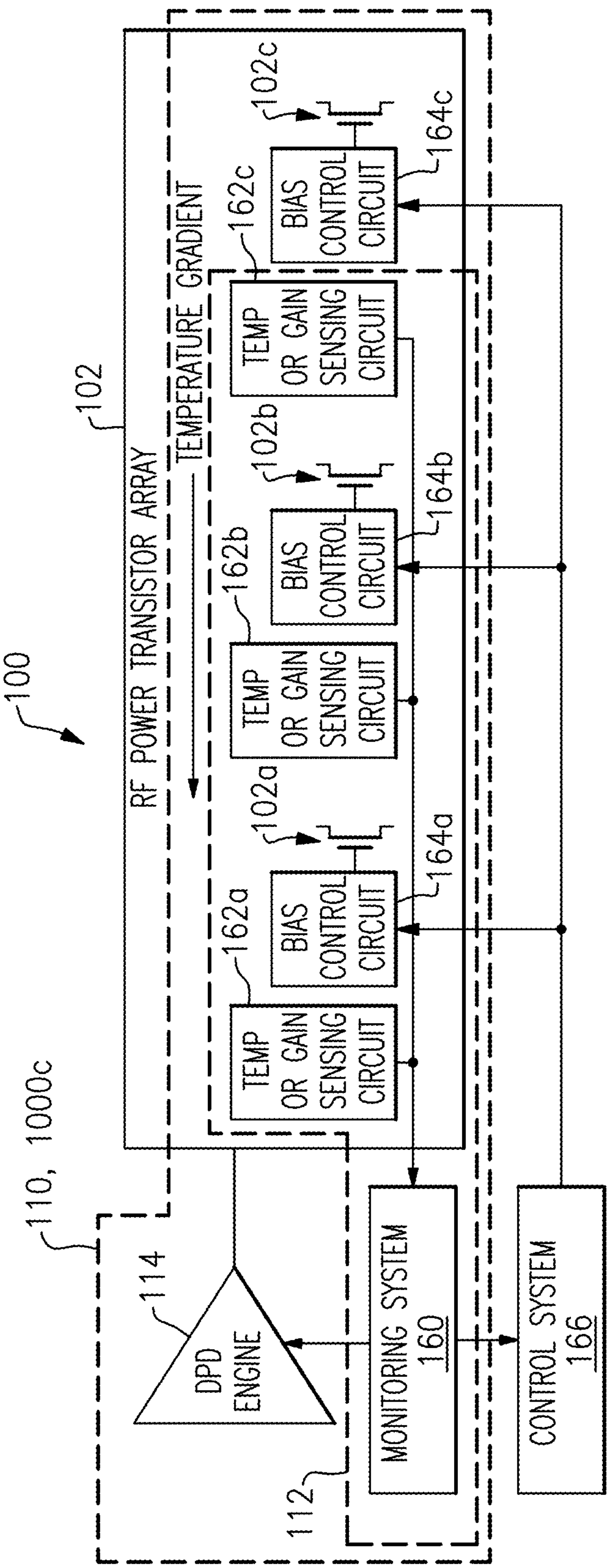
FIG. 10 shows that in some embodiments, local sensors and local bias controls for the respective RF transistors can be configured to allow sensing and control over thermal gradients associated with a power amplifier.

FIG. 10 shows that in some embodiments, local sensors (e.g., 162*a*, 162*b*, 162*c*) and local bias controls (e.g., 164*a*, 164*b*, 164*c*) for the respective RF transistors (e.g., 102*a*, 102*b*, 102*c*) can be configured to allow sensing and control over thermal gradients associated with a power amplifier 102. In FIG. 10, the power amplification system 100 is similar to the example of FIG. 9; however, a control system 166 is shown to provide control for the local bias control circuits (e.g., 164*a*, 164*b*, 164*c*).

In some embodiments, predictive information can be gathered to optimize the array, even after manufacturing. System optimization can rely on an external fast reacting and anticipating multi-variable optimizer instantiated with the digital pre-distortion system 114.

Figure 11:
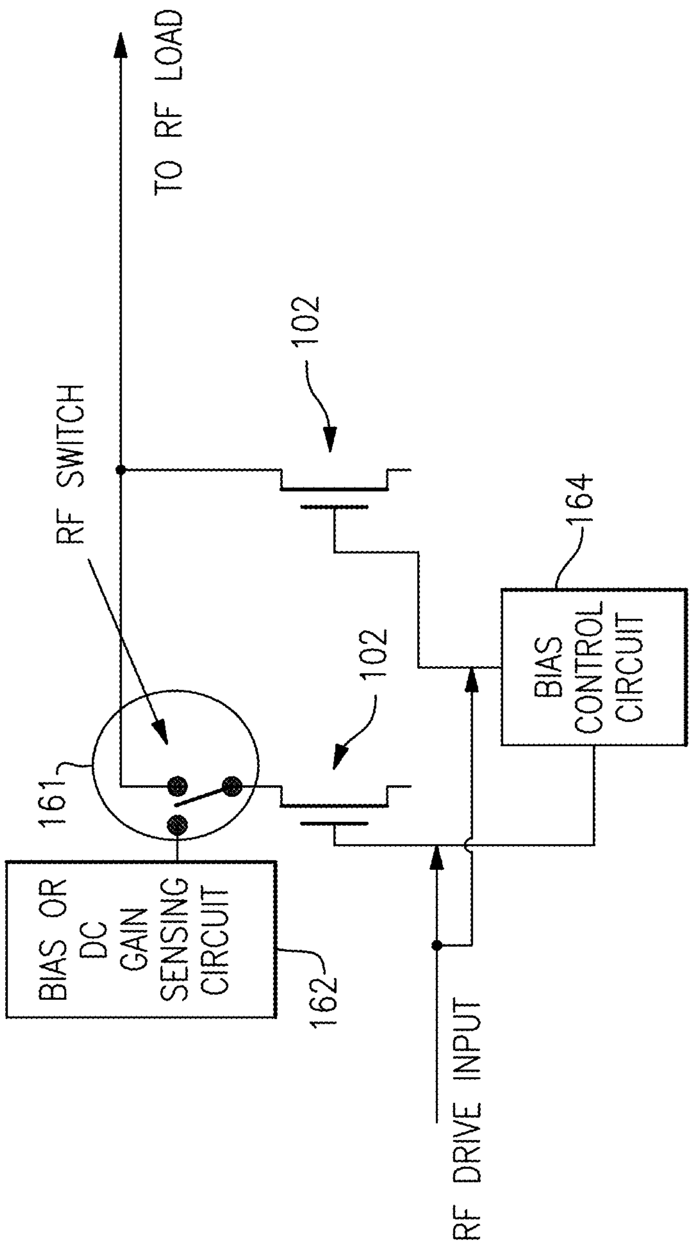
FIG. 11 shows that in some embodiments, for the example of FIG. 10, an RF transistor can have a matched element in the array that can be switched to measure its bias condition.

FIG. 11 shows that in some embodiments, for the example of FIG. 10, an RF transistor 102 can have a matched element 162 in the array that can be switched (e.g., by 161) to measure its bias condition. Such an implementation has a benefit of operating the sensing transistor in very near identical conditions as the main active RF transistors near it.

Accordingly, a desired RF power density can be achieved, allowing the power amplifier to have the same statistical memory (e.g., trapping) affecting the sensing device 162 as the main active device 102.

In some embodiments, the foregoing sensing device 162 can be utilized during transmission gaps. In some embodiments, the sensing device 162 can be utilized carefully during a continuous transmission if the monitoring transistor is sufficiently small. In some embodiments, sensing can be synchronized to the less sensitive portions of the RF frames.

In the example of FIGS. 9-11, a monitor system 112 (112 in FIG. 3) can be considered to include the plurality of sensors (e.g., 162*a*, 162*b*, 162*c*) associated with the power amplifier 102, and the monitoring system 160. A DPD system 114 (114 in FIG. 3) can be considered to include the DPD engine 114. Thus, in some embodiments, a monitor and adapt system for the example of FIGS. 9-11 is indicated as 110, and also as 1000*c*.

Example 4

With advances in DPD algorithms, it is becoming easier to adjust a power amplification system based on variable conditions of operation of an RF power amplifier. For example, average power, frequency, supply voltage, bandwidth temperature and mismatch are conditions associated with such an RF power amplifier. Based on one or more of such conditions, suitable RF performance can be maintained. However, a limitation arises from the number of calibration points needed for the DPD system.

In some embodiments, sufficient computing power, with or without cloud-based computing, can be utilized to alleviate these constraints, thereby allowing finer optimization of the RF power amplifier's transistor array size.

In some embodiments, transistor size array can be optimized dynamically, and be fine-tuned for performance of an RF power transistor array. It is noted that transistor array size is typically the first determinant of power amplifier performance. However, a compromise between performance and reliability (e.g., selected for worst case conditions) is typically made in RF power transistor arrays.

If one allows implementation of a significantly variable array size, a transistor's periphery can be adjusted to conditions similar to when the transistor is being used. For example, such conditions can include lower duty cycle, lower average power or lower temperature than the maximum operating conditions.

In some embodiments, an optimizer can be implemented to include a DPD system capable of learning the characteristics of a power amplifier in its various states so that quasi-seamless transitions can be achieved.

It is noted that in some implementations, transistor array size is fixed, or it is adjusted mostly as a state dependent on the average power level. It is also noted that if such adjustment in made, the transistor size is typically changed during non-transmitting phases of communication.

Figure 12:
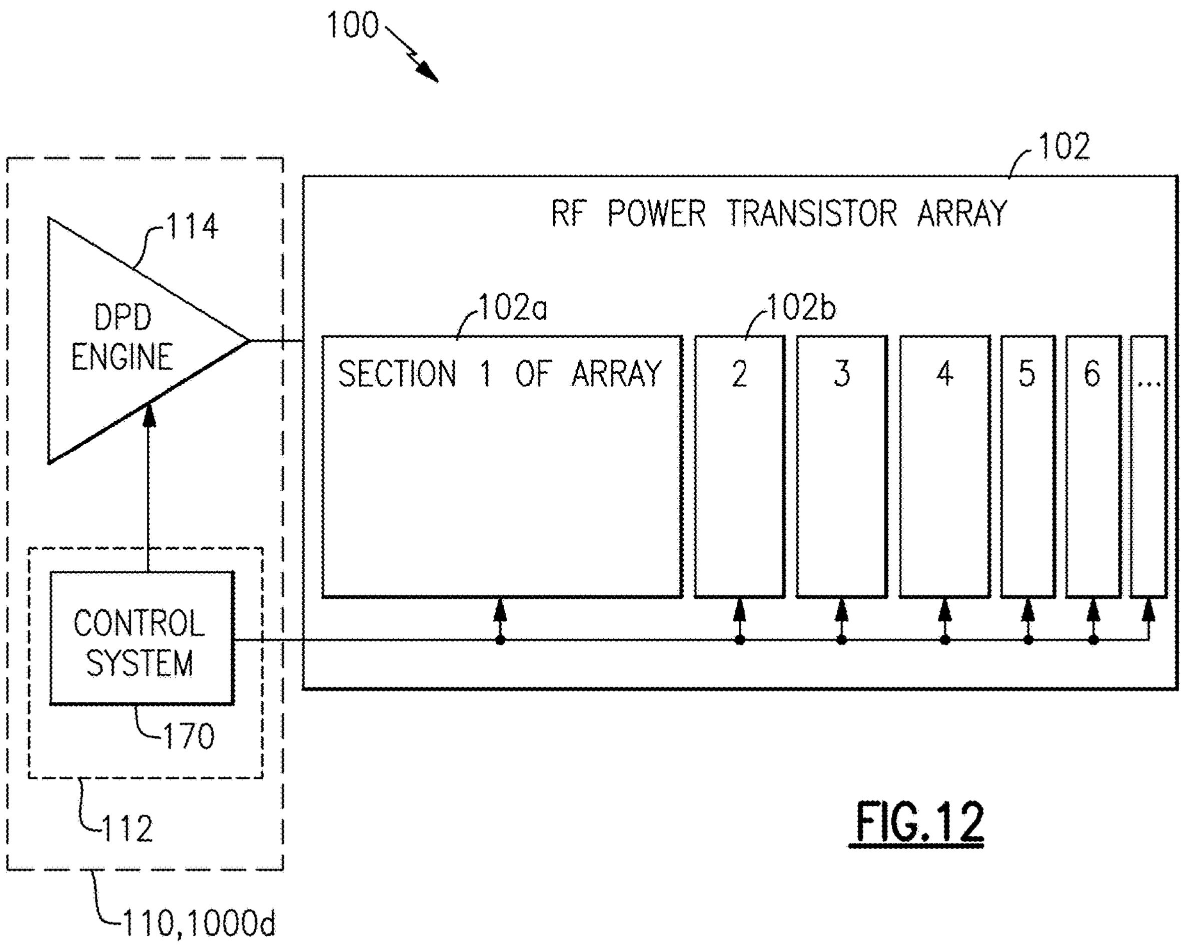
FIG. 12 shows that in some embodiments, a power amplifier of a power amplification system can include an RF transistor array having a plurality of sections, with at least some of the sections being switchable sections.

FIG. 12 shows that in some embodiments, a power amplifier 102 of a power amplification system 100 can include an RF transistor array having a plurality of sections (102*a*, 102*b*). Such sections can allow different sizes to be implemented as the RF transistor array.

In some embodiments, a DPD system including a DPD engine 114 can be configured to learn DPD parameters based on each configuration that has associated with it a different array(s) being used.

In the example of FIG. 12, a control system 170 can be configured to allow switching between the various configurations, based on estimated needs and previous usage data such as average power and other parameters (e.g., temperature). In some embodiments, the DPD engine 114 can be configured to be capable of synchronously changing its parameters to make the transition quasi-seamless.

Figure 13:
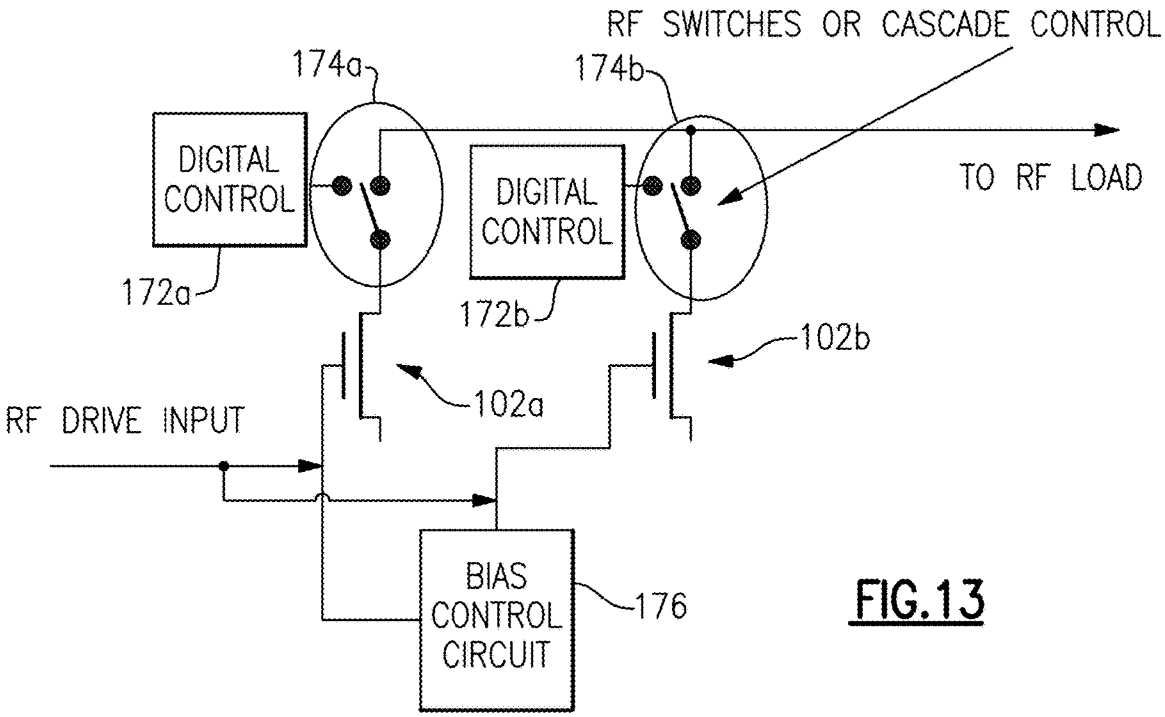
FIG. 13 shows an example of the switchable sections of FIG. 12.

In some embodiments, the example RF transistor array 102 of FIG. 12 can be segmented into multiple switchable sections, using RF switches or cascode controls. An example of such switchable sections is shown in FIG. 13, where a bias control (176) can be adjusted in combination with the change in the number of active sections. In FIG. 13, the switchable sections are indicated as 102*a*, 102*b*, the RF switches or cascode controls are indicated as 174*a*, 174*b*; and control of the RF switches or cascode controls can be provided by respective controllers 172*a*, 172*b*.

In some embodiments, the foregoing adjustment to the number of active sections can be achieved during transmission gaps. Alternatively, similar adjustment can be achieved appropriately during a continuous transmission if the monitoring transistor is sufficiently small. In some embodiments, switching can be synchronized to the less sensitive portions of the RF frames.

In the example of FIGS. 12 and 13, a monitor system 112 (112 in FIG. 3) can be considered to include the control system 170. A DPD system 114 (114 in FIG. 3) can be considered to include the DPD engine 114. Thus, in some embodiments, a monitor and adapt system for the example of FIGS. 12 and 13 is indicated as 110, and also as 1000*d*.

Examples of Combinations of Features

In some embodiments, a power amplification system can include features associated with one or more of the four example embodiments described herein. As described above, FIG. 6 relates to the first example embodiment of a power amplification system 100 having a monitor and adapt system 1000*a*; FIG. 8 relates to the second example embodiment of a power amplification system 100 having a monitor and adapt system 1000*b*; FIG. 9 relates to the third example embodiment of a power amplification system 100 having a monitor and adapt system 1000*c*; and FIG. 12 relates to the fourth example embodiment of a power amplification system 100 having a monitor and adapt system 1000*d*.

FIGS. 14A to 14D show that in some embodiments, a power amplification system can include features associated with one of the four example embodiments described herein.

Figure 14A:
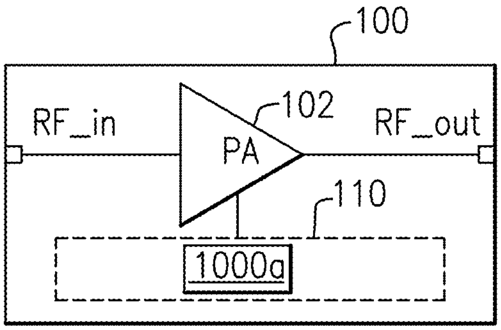
FIGS. 14A to 14D show that in some embodiments, a power amplification system can include features associated with one of the four example embodiments described herein.

For example, FIG. 14A shows that a power amplification system 100 can include a power amplifier 102 and a monitor and adapt system 110 that includes some or all of the features of the monitor and adapt system 1000*a* of the first example of FIG. 6.

Figure 14B:
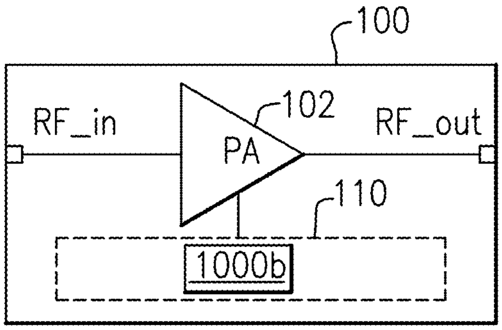

In another example, FIG. 14B shows that a power amplification system 100 can include a power amplifier 102 and a monitor and adapt system 110 that includes some or all of the features of the monitor and adapt system 1000*b* of the second example of FIG. 8.

Figure 14C:
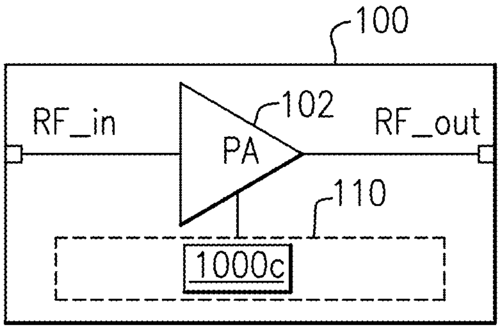

In yet another example, FIG. 14C shows that a power amplification system 100 can include a power amplifier 102 and a monitor and adapt system 110 that includes some or all of the features of the monitor and adapt system 1000*c* of the third example of FIG. 9.

Figure 14D:
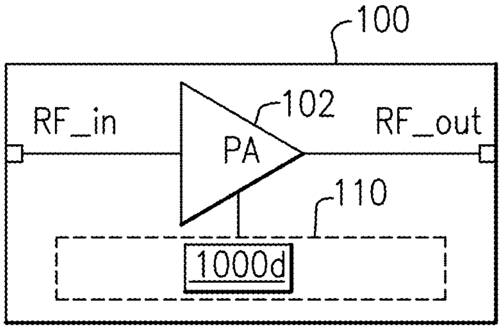

In yet another example, FIG. 14D shows that a power amplification system 100 can include a power amplifier 102 and a monitor and adapt system 110 that includes some or all of the features of the monitor and adapt system 1000*d* of the fourth example of FIG. 12.

FIGS. 15A to 15F show that in some embodiments, a power amplification system can include features associated with two of the four example embodiments described herein.

Figure 15A:
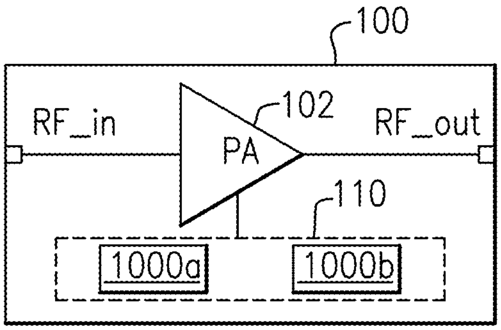
FIGS. 15A to 15F show that in some embodiments, a power amplification system can include features associated with two of the four example embodiments described herein.

For example, FIG. 15A shows that a power amplification system 100 can include a power amplifier 102 and a monitor and adapt system 110 that includes some or all of the features of the monitor and adapt system 1000*a* of the first example of FIG. 6, and some or all of the features of the monitor and adapt system 1000*b* of the second example of FIG. 8.

Figure 15B:
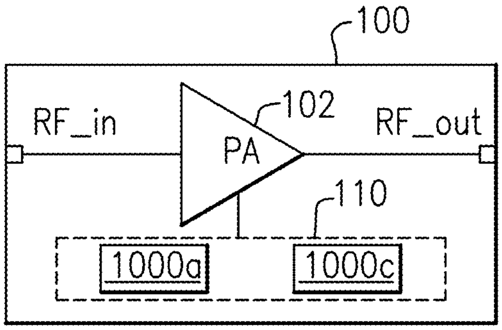

In another example, FIG. 15B shows that a power amplification system 100 can include a power amplifier 102 and a monitor and adapt system 110 that includes some or all of the features of the monitor and adapt system 1000*a* of the first example of FIG. 6, and some or all of the features of the monitor and adapt system 1000*c* of the third example of FIG. 9.

Figure 15C:
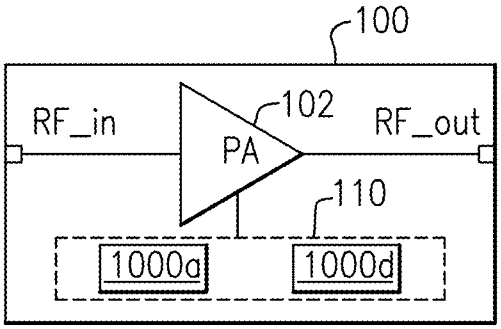

In yet another example, FIG. 15C shows that a power amplification system 100 can include a power amplifier 102 and a monitor and adapt system 110 that includes some or all of the features of the monitor and adapt system 1000*a* of the first example of FIG. 6, and some or all of the features of the monitor and adapt system 1000*d* of the fourth example of FIG. 12.

Figure 15D:
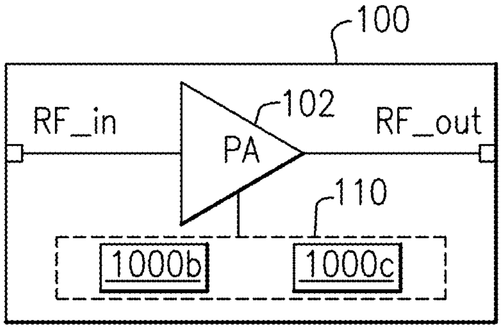

In yet another example, FIG. 15D shows that a power amplification system 100 can include a power amplifier 102 and a monitor and adapt system 110 that includes some or all of the features of the monitor and adapt system 1000*b* of the second example of FIG. 8, and some or all of the features of the monitor and adapt system 1000*c* of the third example of FIG. 9.

Figure 15E:
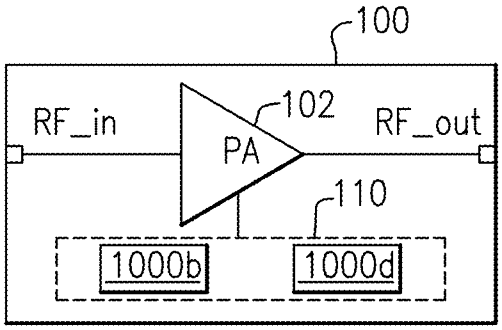
Figure 15F:
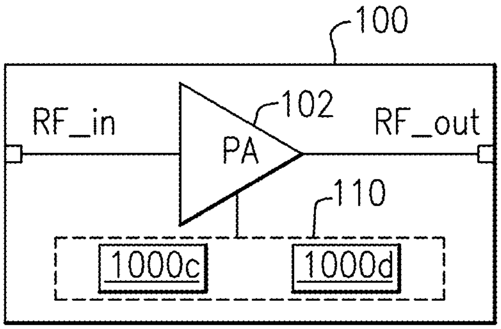

In yet another example, FIG. 15E shows that a power amplification system 100 can include a power amplifier 102 and a monitor and adapt system 110 that includes some or all of the features of the monitor and adapt system 1000*b* of the second example of FIG. 8, and some or all of the features of the monitor and adapt system 1000*d* of the fourth example of FIG. 12.

In yet another example, FIG. 15D shows that a power amplification system 100 can include a power amplifier 102 and a monitor and adapt system 110 that includes some or all of the features of the monitor and adapt system 1000*c* of the third example of FIG. 9, and some or all of the features of the monitor and adapt system 1000*d* of the fourth example of FIG. 12.

FIGS. 16A to 16D show that in some embodiments, a power amplification system can include features associated with three of the four example embodiments described herein.

Figure 16A:
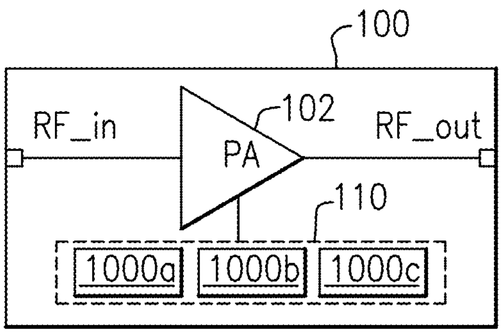
FIGS. 16A to 16D show that in some embodiments, a power amplification system can include features associated with three of the four example embodiments described herein.

For example, FIG. 16A shows that a power amplification system 100 can include a power amplifier 102 and a monitor and adapt system 110 that includes some or all of the features of the monitor and adapt system 1000*a* of the first example of FIG. 6, some or all of the features of the monitor and adapt system 1000*b* of the second example of FIG. 8, and some or all of the features of the monitor and adapt system 1000*c* of the third example of FIG. 9.

Figure 16B:
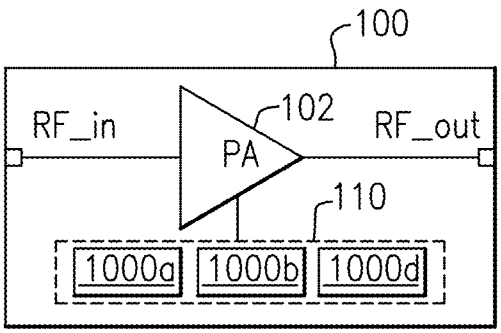

In another example, FIG. 16B shows that a power amplification system 100 can include a power amplifier 102 and a monitor and adapt system 110 that includes some or all of the features of the monitor and adapt system 1000*a* of the first example of FIG. 6, some or all of the features of the monitor and adapt system 1000*b* of the second example of FIG. 8, and some or all of the features of the monitor and adapt system 1000*d* of the fourth example of FIG. 12.

Figure 16C:
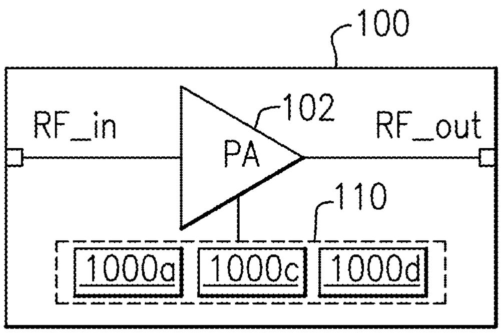

In yet another example, FIG. 16C shows that a power amplification system 100 can include a power amplifier 102 and a monitor and adapt system 110 that includes some or all of the features of the monitor and adapt system 1000*a* of the first example of FIG. 6, some or all of the features of the monitor and adapt system 1000*c* of the third example of FIG. 9, and some or all of the features of the monitor and adapt system 1000*d* of the fourth example of FIG. 12.

Figure 16D:
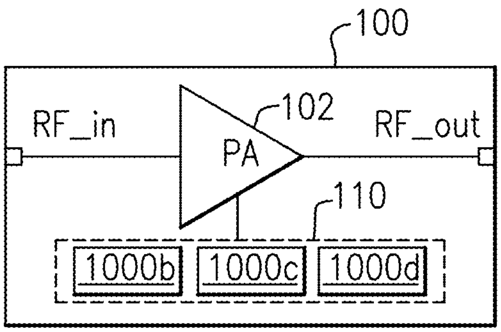

In yet another example, FIG. 16D shows that a power amplification system 100 can include a power amplifier 102 and a monitor and adapt system 110 that includes some or all of the features of the monitor and adapt system 1000*b* of the second example of FIG. 8, some or all of the features of the monitor and adapt system 1000*c* of the third example of FIG. 9, and some or all of the features of the monitor and adapt system 1000*d* of the fourth example of FIG. 12.

Figure 17:
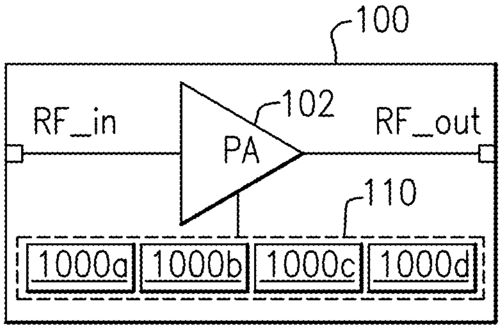
FIG. 17 show that in some embodiments, a power amplification system can include features associated with all of the four example embodiments described herein.

FIG. 17 show that in some embodiments, a power amplification system can include features associated with all of the four example embodiments described herein. More particularly, FIG. 17 shows that a power amplification system 100 can include a power amplifier 102 and a monitor and adapt system 110 that includes some or all of the features of the monitor and adapt system 1000*a* of the first example of FIG. 6, some or all of the features of the monitor and adapt system 1000*b* of the second example of FIG. 8, some or all of the features of the monitor and adapt system 1000*c* of the third example of FIG. 9, and some or all of the features of the monitor and adapt system 1000*d* of the fourth example of FIG. 12.

Examples of System Implementations

Figure 18:
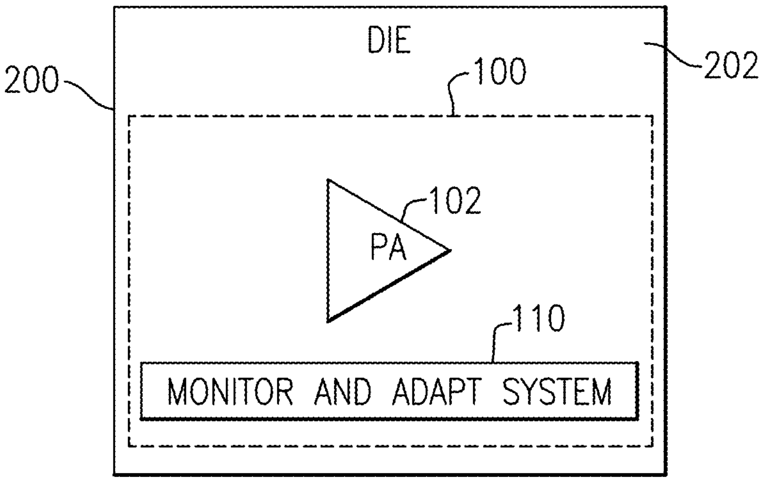
FIG. 18 shows that in some embodiments, a semiconductor die can include a power amplification system having a power amplifier and a monitor and adapt system having one or more features as described herein.
Figure 19:
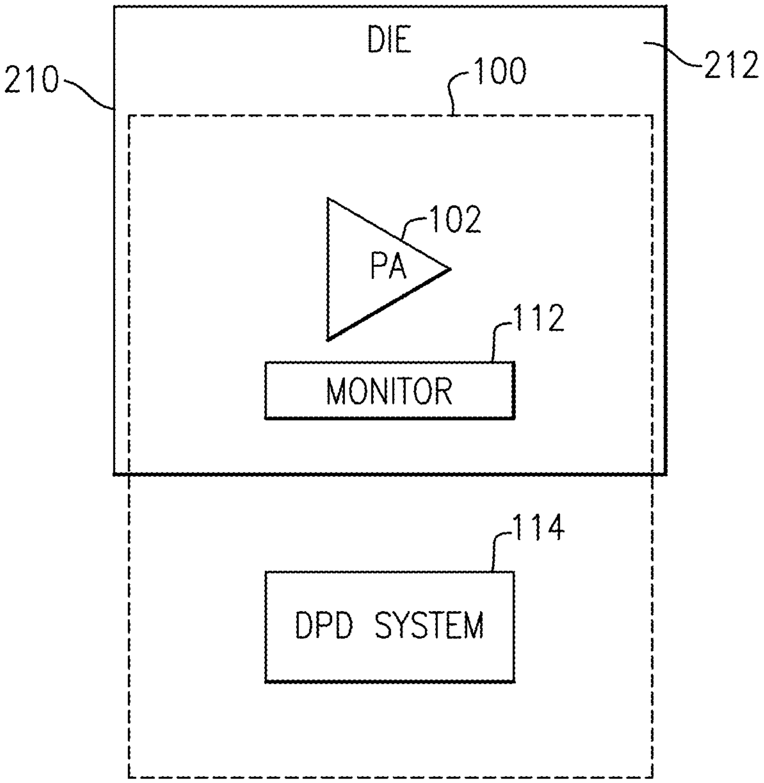
FIG. 19 shows that in some embodiments, a semiconductor die can include a power amplifier of a power amplification system, and at least some of a monitor and adapt system can be implemented outside of the semiconductor die.
Figure 20:
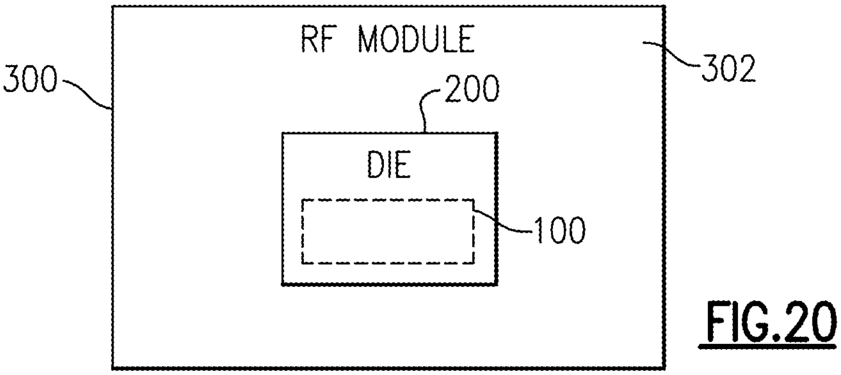
FIG. 20 shows that in some embodiments, an RF module can include a power amplification system 100 having one or more features as described herein.
Figure 21:
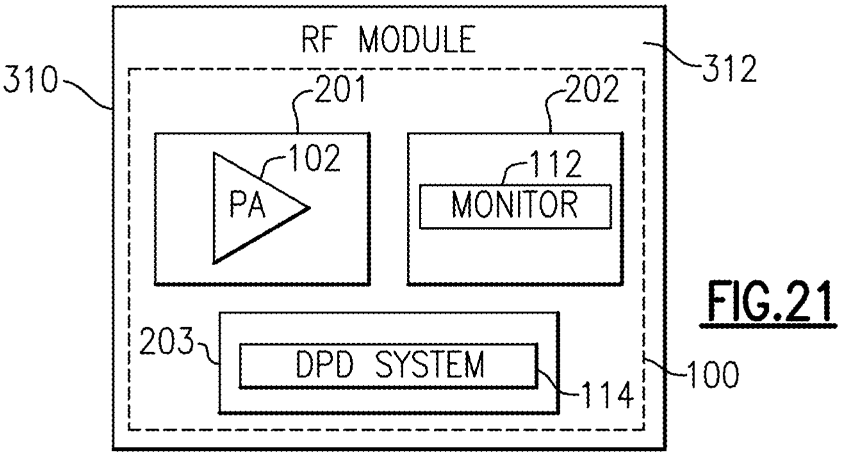
FIG. 21 shows that in some embodiments, an RF module can include a first die having a power amplifier, a second die having a monitor circuit, and a third die having a digital predistortion system.
Figure 22:
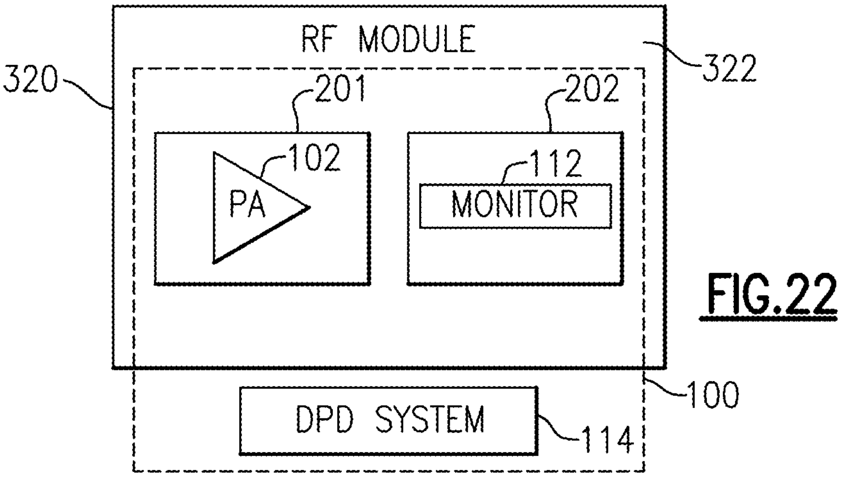
FIG. 22 shows that in some embodiments, an RF module can include a first die having a power amplifier, and a second die having a monitor circuit.

In some embodiments, a power amplification system having one or more features as described herein can be implemented in different products and/or in different locations. FIGS. 18 and 19 show examples of system implementations where a semiconductor die can include some or all of a power amplification system. FIGS. 20 to 22 show examples of system implementations where an RF module can include some or all of a power amplification system. FIGS. 23 to 27 show examples where a power amplification system is a part of a wireless system.

FIG. 18 shows that in some embodiments, a semiconductor die 200 having a substrate 202 can include a power amplification system 100. Such a power amplification system can include a power amplifier 102 and a monitor and adapt system 110 having one or more features as described herein.

FIG. 19 shows that in some embodiments, a semiconductor die 210 having a substrate 202 can include some of a power amplification system 100. Such a power amplification system can include a power amplifier 102 implemented on the semiconductor die 210, and a monitor and adapt system 110 having one portion implemented on the semiconductor die 210, and another portion implemented outside of the semiconductor die 210. For example, a monitor circuit 112 having one or more features as described herein can be implemented on the semiconductor die 210, and a DPD system 114 having one or more features as described herein can be implemented outside of the semiconductor die 210.

FIG. 20 shows that in some embodiments, an RF module 300 having a packaging substrate 302 can include die 200 mounted thereon and having a power amplification system 100, similar to the die 200 of FIG. 18. Such a power amplification system can include a power amplifier 102 and a monitor and adapt system 110 having one or more features as described herein.

FIG. 21 shows that in some embodiments, an RF module 310 having a packaging substrate 312 can include a first die 201 having a power amplifier 102 implemented thereon, a second die 202 having a monitor circuit 112 implemented thereon, and a third die 203 having a DPD system 114 implemented thereon. In such a configuration, the RF module 310 can include substantially all of a power amplification system 100 implemented on a plurality of die.

FIG. 22 shows that in some embodiments, an RF module 320 having a packaging substrate 322 can include a first die 201 having a power amplifier 102 implemented thereon, and a second die 202 having a monitor circuit 112 implemented thereon. A DPD system 114 is shown to be implemented outside of the RF module 320. In such a configuration, the RF module 320 can include a portion of a power amplification system 100 implemented on one or more die (e.g., the PA 102 and the monitor circuit 112), and the other portion (e.g., the DPD system 114) of the amplification system 100 can be implemented away from the RF module 320.

Figure 23:
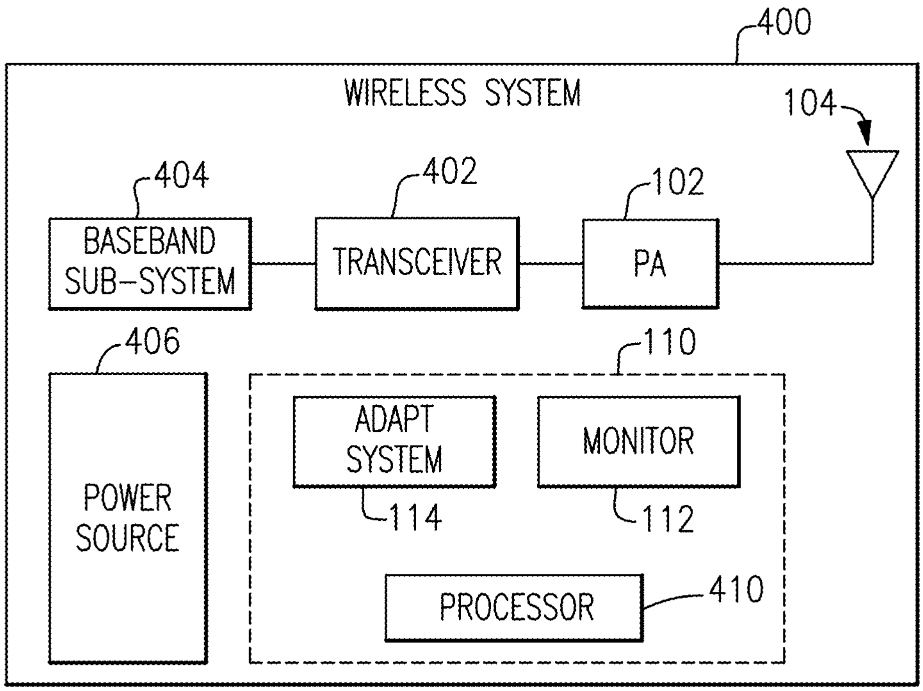
FIG. 23 shows a block diagram of a wireless system that includes a power amplification system having one or more features as described herein.

FIG. 23 shows a block diagram of a wireless system 400 that includes a power amplification system having one or more features as described herein. The power amplification system can include a power amplifier 102, and such a power amplifier can be in communication with a transceiver 402, and receive from the transceiver 402 an RF signal to be amplified and transmitted through an antenna 104. The transceiver 402 can be in communication with a baseband sub-system 404 that is configured to process digital signals. In some embodiments, the baseband sub-system 404 can include at least a portion of a DPD system having one or more features as described herein, and such a DPD system can be a part of the power amplification system.

In the example of FIG. 23, a monitor and adapt system 110 having one or more features as described herein can be a part of the foregoing power amplification system. The monitor and adapt system 110 can include a monitor system 112 and an adapt system 114. In some embodiments, the monitor and adapt system 110 can also include a processor 410 configured to support either or both of the monitor system 112 and the adapt system 114.

In the example of FIG. 23, the wireless system 400 is shown to further include a power source 406 configured to power some or all of the various parts of the wireless system 400.

Figure 24:
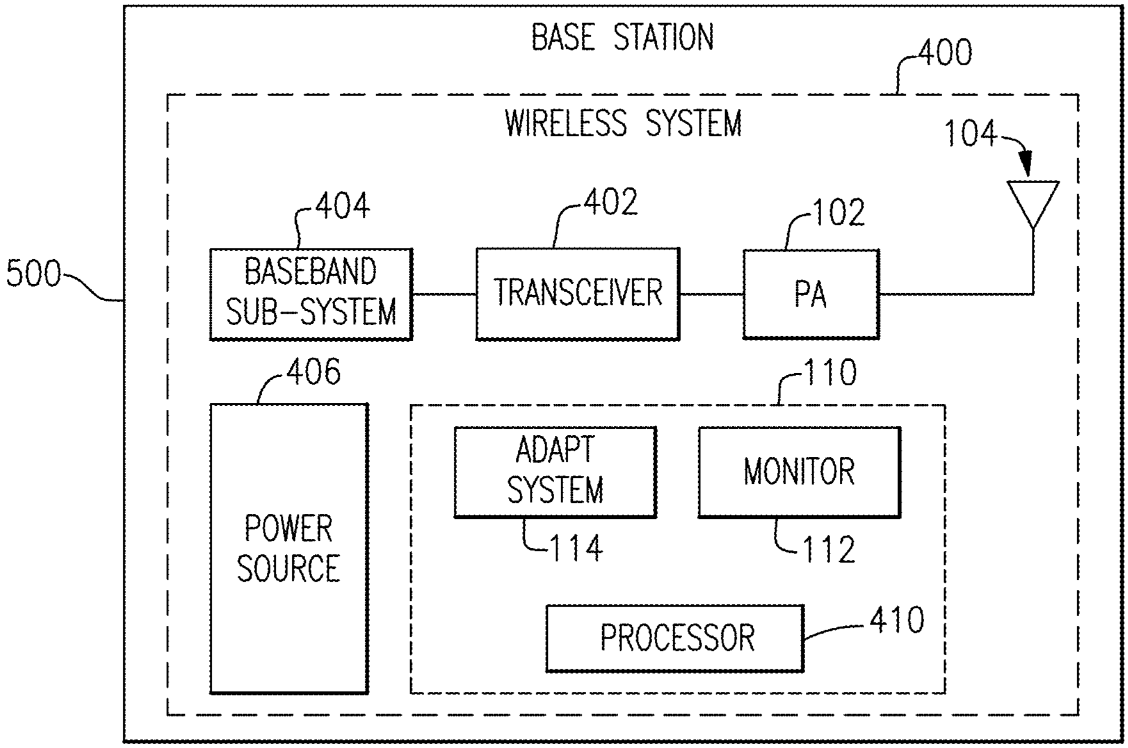
FIG. 24 shows that in some embodiments, substantially all of the wireless system of FIG. 23 can be implemented within a base station such as a cellular base station.

FIG. 24 shows that in some embodiments, substantially all of the wireless system 400 of FIG. 23 can be implemented within a base station 500 such as a cellular base station. In such a configuration, the power source 406 can include, for example, an AC source and a converter that outputs one or more appropriate voltages and/or currents for the operation of the wireless system 400.

In the example of FIG. 24, the processor 410 can be located and operated within the base station 500. For example, the processor 410 can be located and operated within the same building, within the same room, within the same equipment rack, on the same circuit board, and/or within the same enclosure as the other parts of the wireless system 400.

Figure 25:
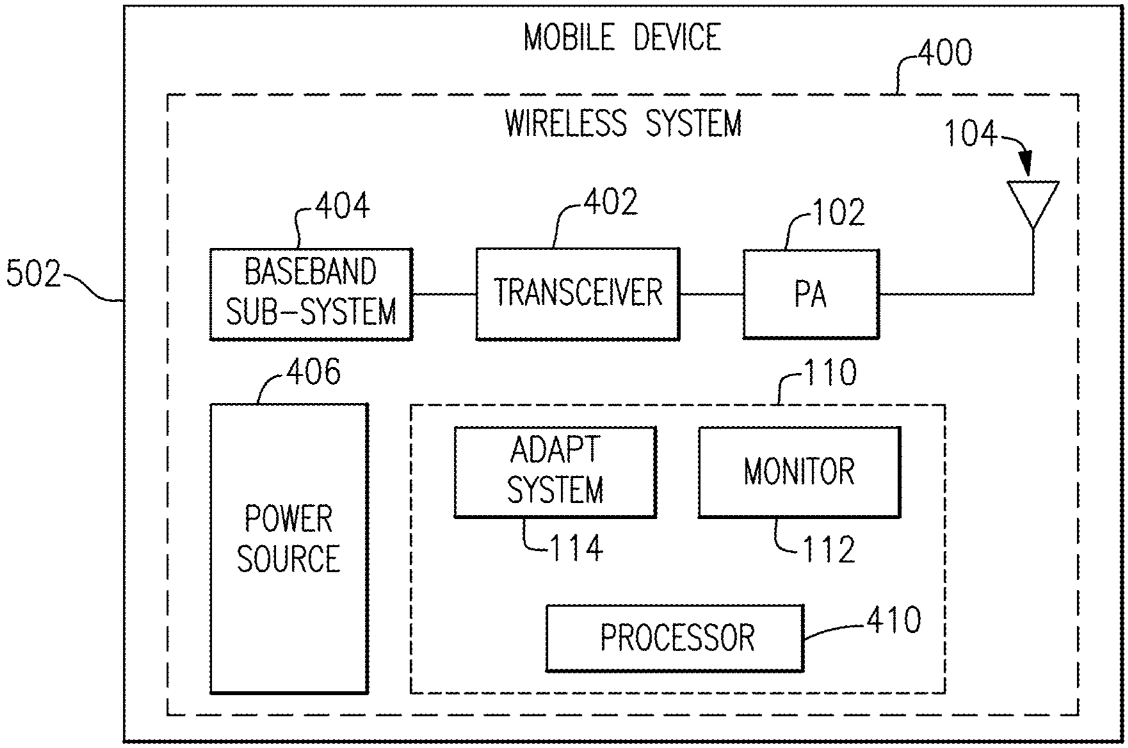
FIG. 25 shows that in some embodiments, substantially all of the wireless system of FIG. 23 can be implemented within a mobile device.

FIG. 25 shows that in some embodiments, substantially all of the wireless system 400 of FIG. 23 can be implemented within a mobile device 502. In such a configuration, the power source 406 can include, for example, a rechargeable or non-rechargeable battery that powers the operation of the wireless system 400.

In the example of FIG. 25, the processor 410 can be located and operated within the mobile device 502. For example, the processor 410 can be located and operated within the same case, and/or within the same circuit as the other parts of the wireless system 400.

Figure 26:
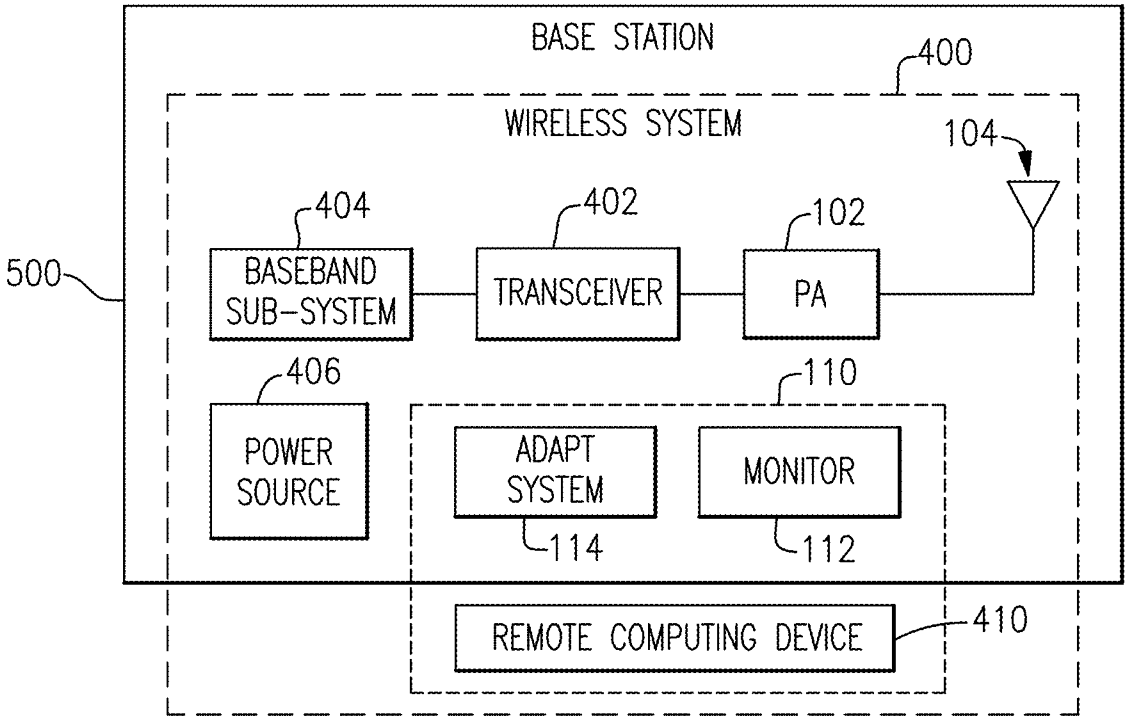
FIG. 26 shows that in some embodiments, a portion of the wireless system of FIG. 23 can be implemented within a base station such as a cellular base station, and another portion of the wireless system can be implemented away from the base station.

FIG. 26 shows that in some embodiments, a portion of the wireless system 400 of FIG. 23 can be implemented within a base station 500 such as a cellular base station, and another portion of the wireless system 400 can be implemented away from the base station 500. For example, a remote computing device 410 can be implemented and operated away from the base station 500; and such a computing device can communicate (e.g., wirelessly and/or through a cable) with the portion of the wireless system 400 within the base station 500.

Figure 27:
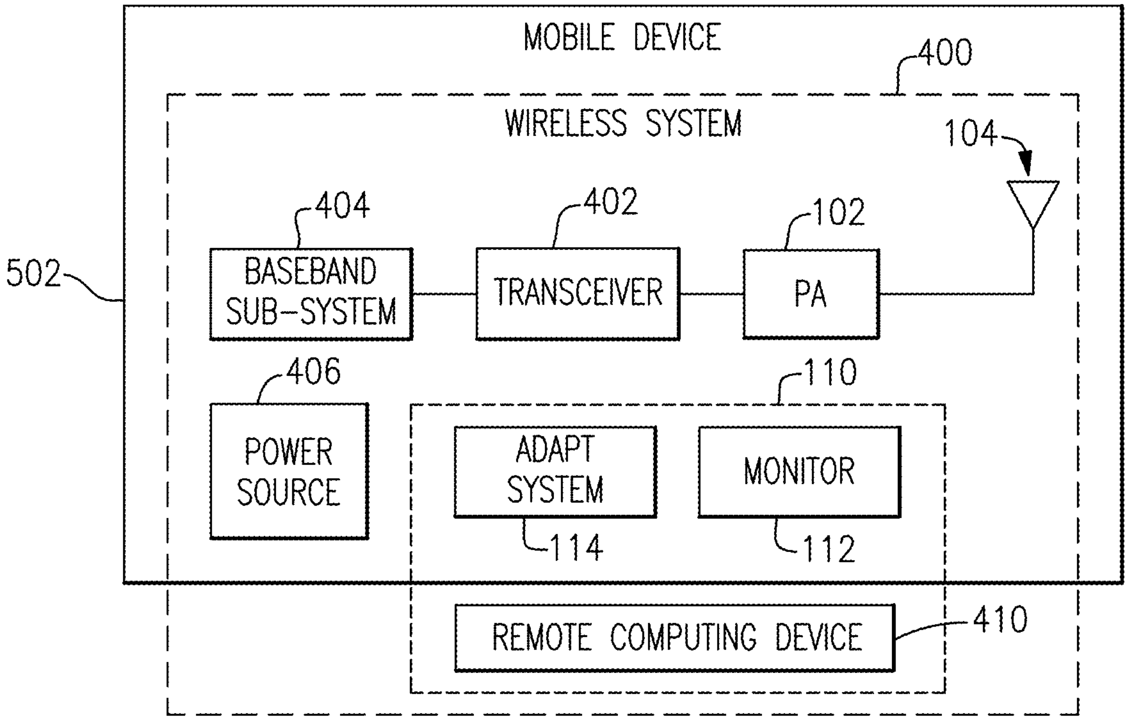
FIG. 27 shows that in some embodiments, a portion of the wireless system of FIG. 23 can be implemented within a mobile device, and another portion of the wireless system can be implemented away from the mobile device.

FIG. 27 shows that in some embodiments, a portion of the wireless system 400 of FIG. 23 can be implemented within a mobile device 502, and another portion of the wireless system 400 can be implemented away from the mobile device 502. For example, a remote computing device 410 can be implemented and operated away from the mobile device 502; and such a computing device can communicate (e.g., wirelessly and/or through a cable) with the portion of the wireless system 400 within the mobile device 502.

It is noted that in some embodiments, the remote computing device 410 of FIGS. 26 and 27 can provide an increased computing capability to support, for example, AI and/or neural network computations being conducted over a "cloud computing internet-based" system, for some or all of the monitor and adapt systems described herein.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:

a power amplifier including an array of transistors having a common input node and a common output node, the array configured to receive an input signal through the common input node and provide an amplified signal through the common output node;

a monitoring system including a plurality of sensing circuits implemented at respective locations of the array; and a control system configured to obtain sensed information from the plurality of sensing circuits, and based on the sensed information, generate a pattern of one or more transistor properties over the array to allow operation of the array in a desired manner based on the pattern, the control system including a local bias control circuit associated with each of the plurality of sensing circuits.

2. The power amplification system of claim 1 wherein the control system is further configured to generate a signal for providing digital predistortion to a digital signal corresponding to the input signal provided to the power amplifier.

3. The power amplification system of claim 1 wherein the control system includes either or both of an artificial intelligence capability and a neural network capability.

4. The power amplification system of claim 3 wherein the control system includes a processor configured to provide either or both of the artificial intelligence capability and the neural network capability.

5. The power amplification system of claim 4 wherein both of the processor and the power amplifier are implemented within same location or device.

6. The power amplification system of claim 4 wherein the processor and the power amplifier are implemented at different locations or devices.

7. The power amplification system of claim 3 wherein the control system is configured to predict at least some of the one or more transistor properties for the generation of the pattern.

8. The power amplification system of claim 3 wherein the plurality of sensing circuits are configured such that the sensed information includes some or all of temperature, gain and bias condition of respective transistors in the array.

9. The power amplification system of claim 8 wherein the transistors are implemented as gallium nitride (GaN) transistors having memory properties.

10. The power amplification system of claim 8 wherein the controller is configured such that the pattern generated by the control system includes a statistical analysis of some or all of the sensed information.

11. A method for operating a power amplification system, the method comprising:

providing an input signal through a common input node to an array of transistors of a power amplifier;

amplifying the input signal with the array to provide an amplified signal through a common output node;

sensing one or more conditions associated with the transistors at a plurality of locations of the array; and generating a pattern of one or more transistor properties based on information from the sensing to allow operation of the array in a desired manner based on the pattern, the operation of the array including providing a local bias control for each of the plurality of locations of the array.

12. The method of claim 11 further comprising performing a digital predistortion operation to a digital signal corresponding to the input signal provided to the power amplifier based on the pattern.

13. The method of claim 11 wherein the generating of the pattern includes either or both of an artificial intelligence operation and a neural network operation.

14. The method of claim 11 wherein the generating of the pattern includes predicting at least some of the one or more transistor properties.

15. The method of claim 11 wherein the sensing of the one or more conditions includes sensing of some or all of temperature, gain and bias condition of respective transistors in the array.

16. A wireless system comprising:

a baseband sub-system;

a power amplifier configured to receive an analog signal representative of a digital signal and provide an amplified signal, the power amplifier including an array of transistors having a common input node and a common output node such that the analog signal is provided to the array of transistors through the common input node and the amplified signal is provided from the array of transistors through the common output node;

an antenna in communication with an output of the power amplifier and configured to support transmission of the amplified signal; and a monitor and adapt system including a plurality of sensing circuits implemented at respective locations of the array, and a control system configured to obtain sensed information from the plurality of sensing circuits, and based on the sensed information, generate a pattern of one or more transistor properties over the array to allow operation of the array in a desired manner based on the pattern, the control system including a local bias control circuit associated with each of the plurality of sensing circuits.

17. The wireless system of claim 16 wherein the wireless system is implemented in a base station.

18. The wireless system of claim 17 wherein the base station includes a cellular base station functionality.

19. The wireless system of claim 16 wherein the wireless system is implemented in a mobile device.

20. The wireless system of claim 19 wherein the mobile device includes a cellular functionality.

* * * * *